(12) United States Patent
Huang et al.

(10) Patent No.: US 8,383,319 B2
(45) Date of Patent: Feb. 26, 2013

(54) LITHOGRAPHIC PRINTING PLATE PRECURSORS AND STACKS

(75) Inventors: Jianbing Huang, Trumbull, CT (US); Shashikant Saraiya, Fort Collins, CO (US); Frederic E. Mikell, Greeley, CO (US); Eiji Hayakawa, Utsunomiya (JP); Hirokazu Fujii, Kumagaya (JP); Akira Igarashi, Kumagaya (JP)

(73) Assignee: Eastman Kodak Company, Rochester, NY (US)

( * ) Notice: Subject to any disclaimer, the term of this patent is extended or adjusted under 35 U.S.C. 154(b) by 627 days.

(21) Appl. No.: 12/546,769

(22) Filed: Aug. 25, 2009

(65) Prior Publication Data

US 2011/0053085 A1  Mar. 3, 2011

(51) Int. Cl.
*B41N 1/00* (2006.01)
*G03F 7/00* (2006.01)
*G03F 7/26* (2006.01)
*B41M 5/00* (2006.01)

(52) U.S. Cl. .......... 430/271.1; 430/270.1; 430/302; 101/453; 101/463.1

(58) Field of Classification Search .......... 430/302, 430/270.1; 101/450.1, 453, 463.1
See application file for complete search history.

(56) References Cited

U.S. PATENT DOCUMENTS

| | | | |
|---|---|---|---|
| 5,677,110 A * | 10/1997 | Chia et al. | 430/302 |
| 6,399,270 B1 | 6/2002 | Mori et al. | |
| 6,692,890 B2 * | 2/2004 | Huang et al. | 430/270.1 |
| 7,097,956 B2 * | 8/2006 | Miyamoto et al. | 430/270.1 |
| 2003/0113666 A1 * | 6/2003 | Endo | 430/281.1 |
| 2007/0006760 A1 * | 1/2007 | Hoshi | 101/454 |
| 2007/0287095 A1 | 12/2007 | Endo | |
| 2008/0154007 A1 * | 6/2008 | Mori et al. | 526/328.5 |

FOREIGN PATENT DOCUMENTS

| | | |
|---|---|---|
| EP | 0 716 345 | 6/1996 |
| EP | 1 705 002 A1 | 9/2006 |
| EP | 1 839 853 | 10/2007 |
| EP | 1 865 380 | 12/2007 |
| WO | WO 2004/067290 A1 | 8/2004 |
| WO | WO 2008/140726 A1 | 11/2008 |

OTHER PUBLICATIONS

U.S. Appl. No. 12/336,635, filed Dec. 17, 2008, titled Stack of Negative-Working Imageable Elements, by K.B. Ray et al.

* cited by examiner

*Primary Examiner* — Cynthia Kelly
*Assistant Examiner* — Chanceity Robinson
(74) *Attorney, Agent, or Firm* — J. Lanny Tucker

(57) ABSTRACT

Lithographic printing plate precursors have been designed so that they can be stored, shipped, and used in stacks without interleaf paper between individual precursors. This is achieved by incorporating polymeric particles having an average diameter of from about 3 to about 20 μm into the outermost precursor layer such as an imagable layer or topcoat. The polymeric particles comprise a core of a crosslinked polymer and have grafted hydrophilic polymeric surface groups that are grafted onto the particle surfaces by polymerizing hydrophilic monomers in the presence of the crosslinked polymeric particles. The lithographic printing plates can be either negative- or positive-working elements.

14 Claims, 2 Drawing Sheets

LITHOGRAPHIC PRINTING PLATE PRECURSORS AND STACKS

FIELD OF THE INVENTION

This invention relates to imagable elements that contain certain crosslinked polymeric particles in specific layers. This invention also relates to a method of providing imaged and processed elements such as lithographic printing plates. This invention further relates to stacks of lithographic printing plate precursors that are provided for shipping, storage, or use without interleaf papers between the individual precursors that can be either negative- or positive-working elements.

BACKGROUND OF THE INVENTION

Radiation-sensitive compositions are routinely used in the preparation of imagable materials including lithographic printing plate precursors. Such compositions generally include a radiation-sensitive component, an initiator system, and a binder, each of which has been the focus of research to provide various improvements in physical properties, imaging performance, and image characteristics.

Recent developments in the field of printing plate precursors concern the use of radiation-sensitive compositions that can be imaged by means of lasers or laser diodes, and more particularly, that can be imaged and/or developed on-press. Laser exposure does not require conventional silver halide graphic arts films as intermediate information carriers (or "masks") since the lasers can be controlled directly by computers. High-performance lasers or laser-diodes that are used in commercially-available image-setters generally emit radiation having a wavelength of at least 700 nm, and thus the radiation-sensitive compositions are required to be sensitive in the near-infrared or infrared region of the electromagnetic spectrum. However, other useful radiation-sensitive compositions are designed for imaging with ultraviolet or visible radiation.

There are two possible ways of using radiation-sensitive compositions for the preparation of printing plates. For negative-working printing plates, exposed regions in the radiation-sensitive compositions are hardened and unexposed regions are washed off during development. For positive-working printing plates, the exposed regions are dissolved in a developer and the unexposed regions become an image.

Usually lithographic printing plate precursors are supplied to customers in a stack of multiple elements, usually several hundred elements, with interleaf (or slip sheet) papers between adjacent precursors to prevent adhesion to one another and scratches on the imagable side. Without such interleaf papers, damage to the imagable side may occur during factory finishing operations, transportation, storage, or during use in plate setter devices.

There has been a desire to eliminate the use of interleaf paper to reduce waste and to simplify the loading process into imaging devices. One approach for doing this is described in EP 1,865,380 (Endo) in which silica-coated polymer particles are added to the topcoat. Organic filler particles are used in a similar manner in the materials of EP 1,839,853 (Yanaka et al.).

Copending and commonly assigned U.S. Ser. No. 12/336, 635 (filed Dec. 17, 2008 by Ray, Mulligan, and Beckley) describes stacks of negative-working imagable elements that do not require interleaf papers because of the use of a thin topcoat layer over the imagable layer.

There remains a need to find a way to stack imagable elements such as lithographic printing plate precursors without the need for interleaf papers. While various particles have been incorporated into outermost layers of such elements when interleaf papers are omitted, there is a propensity for such particles to come out of the coatings, leaving voids in the outermost layer and settling in developer solutions used in processing the imaged elements.

SUMMARY OF THE INVENTION

The present invention provides a lithographic printing plate precursor comprising a substrate and having thereon an imagable layer, the precursor comprising in its outermost layer, polymeric particles having an average diameter of from about 3 to about 20 µm, and the polymeric particles comprising a core of a crosslinked polymer and having grafted hydrophilic polymeric surface groups, which polymeric surface groups are grafted onto the particle surfaces by polymerizing hydrophilic monomers in the presence of the crosslinked polymeric particles.

In some embodiments, the lithographic printing plate precursor is negative-working and the imagable layer comprises:
  a free radically polymerizable component,
  an initiator composition capable of generating radicals sufficient to initiate polymerization of the free radically polymerizable component upon exposure to imaging radiation,
  a radiation absorbing compound, and
  a polymeric binder.

In some negative-working embodiments, imagable layer comprises:
  a free radically polymerizable component,
  an initiator composition capable of generating radicals sufficient to initiate polymerization of the free radically polymerizable component upon exposure to imaging radiation,
  an infrared radiation dye, and
  a polymeric binder that is either film-forming or present at least partially as discrete particles,
  the precursor further comprising a topcoat disposed on the imagable layer, which topcoat comprises a poly(vinyl alcohol), and the polymeric particles.

In the negative-working lithographic printing plate precursors, there can be an aluminum-containing substrate having disposed thereon a single imagable layer and an outermost topcoat, in which the single imagable layer comprises:
  a radically polymerizable component,
  an initiator composition capable of generating free radicals sufficient to initiate polymerization of free radically polymerizable groups upon exposure to imaging infrared radiation,
  a polymeric binder, and
  a radiation absorbing compound that can be an infrared radiation absorbing dye.

This invention also provides a method of providing a lithographic printing plate comprising:
  A) imagewise exposing the lithographic printing plate precursor of this invention that is negative-working, to provide both exposed and non-exposed regions in the imagable layer, and
  B) processing the imaged precursor to remove the non-exposed regions.

In addition, this invention provides a stack of at least 5 of the lithographic printing plate precursors wherein the outermost layer of each precursor is in direct contact with the substrate of each successive precursor in the stack.

We have discovered a way to eliminate the use of interleaf paper. We have found that interleaf papers can be avoided in stacks of lithographic printing plate precursors if certain crosslinked polymeric particles are used in the topcoat or imagable layer. These polymeric particles have a unique size that is an average largest dimension of from about 3 to about 20 µm. They comprise a core of a crosslinked polymer and have grafted hydrophilic polymeric surface groups. These polymeric surface groups are grafted onto the particle surfaces by polymerizing hydrophilic monomers in the presence of the crosslinked polymeric particles.

DETAILED DESCRIPTION OF THE INVENTION

Definitions

Figure 1:
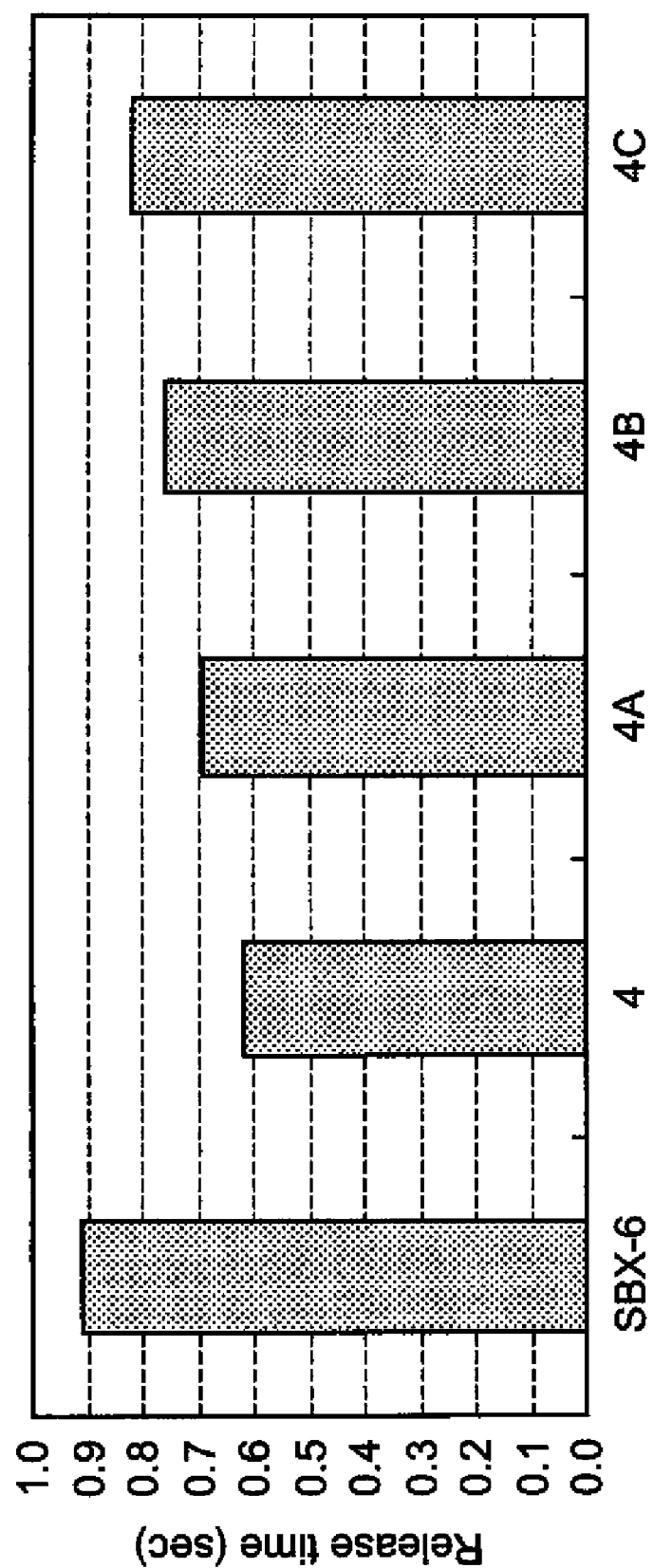
FIG. 1 is graphical representation of the results obtained with several embodiments of this invention as shown in the Examples below.

Unless the context indicates otherwise, when used herein, the terms "negative-working lithographic printing plate precursor", "positive-working lithographic printing plate precursor", and "printing plate precursor" are meant to be references to embodiments of the present invention.

In addition, unless the context indicates otherwise, the various components described herein such as "polymeric binder", "free radically polymerizable component", "radiation absorbing compound", and similar terms also refer to mixtures of such components. Thus, the use of the articles "a", "an", and "the" is not necessarily meant to refer to only a single component.

Moreover, unless otherwise indicated, percentages refer to percents by dry weight.

For clarification of definitions for any terms relating to polymers, reference should be made to "Glossary of Basic Terms in Polymer Science" as published by the International Union of Pure and Applied Chemistry ("IUPAC"), *Pure Appl. Chem.* 68, 2287-2311 (1996). However, any definitions explicitly set forth herein should be regarded as controlling.

The term "polymer" refers to high and low molecular weight polymers including oligomers, homopolymers, and copolymers.

The term "copolymer" refers to polymers that are derived from two or more different monomers.

The term "backbone" refers to the chain of atoms (carbon or heteroatoms) in a polymer to which a plurality of pendant groups are attached. One example of such a backbone is an "all carbon" backbone obtained from the polymerization of one or more ethylenically unsaturated polymerizable monomers. However, other backbones can include heteroatoms wherein the polymer is formed by a condensation reaction or some other means.

The lithographic printing plate precursors can be any desired configuration, composition, substrate, and layer construction as long as the outermost layer has the desired polymeric particles described below. For example, these precursors can be sensitive to imaging radiation within the wide range of from about 150 to about 1400 nm, but they are more likely sensitive to imaging radiation of either from about 150 to about 450 nm or from about 700 to about 1250 nm.

The negative-working lithographic printing plate precursors can be on-press developable, or designed for development off-press. Some of the on-press developable precursors have an imagable layer comprising a polymeric binder that has a backbone to which are attached pendant poly(alkylene oxide) side chains, cyano groups, or both, and is optionally present in the form of discrete particles.

By "stack", we mean a combination of at least 5 individual lithographic printing plate precursors arranged with the support of an overlying precursor in direct contact with the outermost layer of the precursor beneath it, but without any interleaf paper between individual precursors. In most embodiments, a stack has at least 100 individual precursors, and typically at least 500 individual precursors.

Polymeric Particles

The polymeric particles used in this invention to provide the advantages noted above have an average diameter of from about 3 to about 20 µm (typically from about 3 to about 8 µm). This dimension is measured using conventional means such as using a commercially available Microtrac UPA150. The polymeric particles are generally spherical in shape but there can be some variation in the shape among the particles.

The polymeric particles comprise a "core" of a crosslinked polymer. By "core", we mean that at least 95 volume % of the particles are composed in the crosslinked polymer or mixture of crosslinked polymers. Such polymers can be formed from monomer having one or more ethylenically unsaturated polymerizable monomers. Examples of monomers having one polymerizable group include but are not limited to, styrene monomers including styrene and 4-methylstyrene and (meth)acrylates such as methyl methacrylate, ethyl methacrylate, and n-butyl methacrylate. Examples of monomers having more than one polymerizable group include but are not limited to divinyl benzene and ethylene glycol di(meth)acrylate. The polymeric particles are crosslinked so that they will remain as discrete particles without coalescence or agglomeration in solvents or when heated.

These crosslinked polymeric particles can be prepared using known polymerization conditions and reactants. Exemplary reaction conditions are shown below in Preparations 1 through 8.

The outer surfaces of the crosslinked polymeric particles have grafted hydrophilic polymeric surface groups. These polymeric surface groups are grafted onto the particle surfaces by polymerizing hydrophilic monomers in the presence of the crosslinked polymeric particles. Representative hydrophilic monomers include but are not limited to, monomers having an ethylenically unsaturated group and one or more hydrophilic groups selected from amide, sulfonic acid, sulfonic acid salts, carboxlic acid, carboxylic acid salts, phosphoric acid, phosphoric acid salts, phosphonic acid, phosphonic acid salts, and polyalkylene oxide groups. Specific examples of hydrophilic monomers include but are not limited to, acrylic acid, methacrylic acid, acrylamide, methacrylamide, 2-acrylamido-2-methyl-1-propyl sulfonic acid sodium salt, sodium p-styrenesulfonate, mono-, di-, or polyethylene glycol methacrylate phosphate, polyethylene glycol methacrylate, polyethylene glycol methyl ether methacrylate, vinyl pyrrolidone, maleic acid, maleic acid monoethyl ester, 2-hydroxyethyl methacrylate, vinyl phosphonic acid, 2,2-dimethylaminoethyl methacrylate and its salts, vinylpyridine and its salts. Mixtures of these hydrophilic monomers can also be used as long as they do not have adverse interactions such as formation of ionic networks between the polymeric surface groups. Small amounts of non-hydrophilic monomers may also be added to the monomer mixture and copolymerized as long as the copolymers of such monomer mixtures are hydrophilic enough to be soluble or swellable in water. The grafted hydrophilic polymeric surface groups can comprise up to 10 recurring units.

The hydrophilic polymeric surface groups can be attached in general by heating the crosslinked polymeric particles and ethylenically unsaturated polymerizable monomers having hydrophilic groups in a reaction solvent in the presence of a suitable free radical initiator at a temperature suitable for the chosen free radical initiator. Preferably, the reaction solvent is such that it can dissolve the ethylenically unsaturated polymerizable monomers and polymers of such monomers. More typically, the reaction solvent is such that it can also partially swell the crosslinked polymeric particles for effective surface grafting. Such reaction solvents include water, dimethyl sulfoxide (DMSO), N,N-dimethylformamide (DMF), N,N-dimethylacetamide (DMAC), 2-ethoxyethanol, and Dowanol® PM. After polymerization and grafting of the surface polymer groups, the modified crosslinked polymeric particles can be collected by filtration and optional washing with water or a suitable organic solvent. If acidic monomers are used for forming the surface polymer groups, the surface groups can be neutralized using a suitable base. Representative procedures are shown in Preparations 1 through 8A shown below with the Examples.

Other surface modification procedures are described in U.S. Pat. No. 6,325,939 (Strom et al.).

Still another technique involves reacting hydrophilic polymers in the presence of the crosslinked polymeric particles and a suitable free radical catalyst.

The crosslinked polymeric particles described herein are incorporated into the outermost layer of the lithographic printing plate precursor. In some instances, this is an imagable layer as described below (especially for negative-working imagable layers), but in many embodiments, this outermost layer is a topcoat that is applied over a single imagable layer in negative-working lithographic printing plate precursors.

The dry coverage of the crosslinked polymeric particles with hydrophilic surface polymeric groups is generally at least 0.001 g/m$^2$ and up to 0.5 g/m$^2$, or typically from about 0.005 to about 0.25 g/m$^2$. When used in topcoats, the polymeric particles have an average diameter in μm that is at least 100% and up to 400% of the dry coverage of the topcoat in g/m$^2$. Thus, if they are present in a topcoat disposed over the imagable layer, the coverage of the topcoat is generally thin enough so that many of the particles protrude through the topcoat surface because their diameter is generally greater than the dry thickness of the topcoat, and their diameter can be as much as 4 times the topcoat thickness.

If the polymeric particles are present in an outermost imagable layer, they can be present in sufficient amounts so that some of them protrude through the outer surface.

Negative-Working Lithographic Printing Plate Precursors

Useful imagable layer compositions and details of their preparation and use are provided in the following patent, publication, and copending patent applications, all of which are incorporated herein by reference:

U.S. Pat. No. 7,452,638 (Yu et al.),

U.S. Patent Application Publication 2008/0254387 (Yu et al.),

U.S. Patent Application Publication 2008/0299488 (Yu et al.),

U.S. Patent Application Publication 2008/0311520 (Yu et al.),

U.S. Ser. No. 12/104,544 (filed Apr. 17, 2008 by Ray et al.), and

U.S. Ser. No. 12/177,208 (filed Jul. 22, 2008 by Yu et al.).

In general, the negative-working lithographic printing plate precursors have a radiation-sensitive composition disposed on a suitable substrate to form an imagable layer. In many embodiments, the radiation-sensitive composition is infrared radiation-sensitive.

The radiation-sensitive composition (and imagable layer) includes one or more free radically polymerizable components, each of which contains one or more free radically polymerizable groups that can be polymerized using free radical initiation. For example, such free radically polymerizable components can contain one or more free radical polymerizable monomers or oligomers having one or more addition polymerizable ethylenically unsaturated groups, crosslinkable ethylenically unsaturated groups, ring-opening polymerizable groups, azido groups, aryldiazonium salt groups, aryldiazosulfonate groups, or a combination thereof. Similarly, crosslinkable polymers having such free radically polymerizable groups can also be used. Oligomers or prepolymers, such as urethane acrylates and methacrylates, epoxide acrylates and methacrylates, polyester acrylates and methacrylates, polyether acrylates and methacrylates, and unsaturated polyester resins can be used. In some embodiments, the free radically polymerizable component comprises carboxy groups.

Free radically polymerizable compounds include those derived from urea urethane(meth)acrylates or urethane(meth)acrylates having multiple polymerizable groups. For example, a free radically polymerizable component can be prepared by reacting DESMODUR® N100 aliphatic polyisocyanate resin based on hexamethylene diisocyanate (Bayer Corp., Milford, Conn.) with hydroxyethyl acrylate and pentaerythritol triacrylate. Useful free radically polymerizable compounds include NK Ester A-DPH (dipentaerythritol hexaacrylate) that is available from Kowa American, and Sartomer 399 (dipentaerythritol pentaacrylate), Sartomer 355 (di-trimethylolpropane tetraacrylate), Sartomer 295 (pentaerythritol tetraacrylate), and Sartomer 415 [ethoxylated (20)trimethylolpropane triacrylate] that are available from Sartomer Company, Inc.

Numerous other free radically polymerizable components are known to those skilled in the art and are described in considerable literature including *Photoreactive Polymers: The Science and Technology of Resists*, A Reiser, Wiley, New York, 1989, pp. 102-177, by B. M. Monroe in *Radiation Curing: Science and Technology*, S. P. Pappas, Ed., Plenum, New York, 1992, pp. 399-440, and in "Polymer Imaging" by A. B. Cohen and P. Walker, in *Imaging Processes and Material*, J. M. Sturge et al. (Eds.), Van Nostrand Reinhold, New York, 1989, pp. 226-262. For example, useful free radically polymerizable components are also described in EP 1,182,033A1 (Fujimaki et al.), beginning with paragraph [0170], and in U.S. Pat. No. 6,309,792 (Hauck et al.), U.S. Pat. No. 6,569,603 (Furukawa), and U.S. Pat. No. 6,893,797 (Munnelly et al.). Other useful free radically polymerizable components include those described in U.S. Patent Application Publication 2009/0142695 (Bauman et al.) that include 1H-tetrazole groups.

In addition to, or in place of the free radically polymerizable components described above, the radiation-sensitive composition may include polymeric materials that include side chains attached to the backbone, which side chains include one or more free radically polymerizable groups (such as ethylenically unsaturated groups) that can be polymerized (crosslinked) in response to free radicals produced by the initiator composition (described below). There may be at least two of these side chains per molecule. The free radically polymerizable groups (or ethylenically unsaturated groups) can be part of aliphatic or aromatic acrylate side chains attached to the polymeric backbone. Generally, there are at least 2 and up to 20 such groups per molecule.

Such free radically polymerizable polymers can also comprise hydrophilic groups including but not limited to, carboxy, sulfo, or phospho groups, either attached directly to the backbone or attached as part of side chains other than the free radically polymerizable side chains.

The one or more free radically polymerizable components (monomeric, oligomeric, or polymeric) can be present in the imagable layer in an amount of at least 10 weight % and up to 80 weight %, and typically from about 20 to about 50 weight %, based on the total dry weight of the imagable layer. The weight ratio of the free radically polymerizable component to the total polymeric binders (described below) is generally from about 5:95 to about 95:5, and typically from about 10:90 to about 90:10, or even from about 30:70 to about 70:30.

The radiation-sensitive composition also includes an initiator composition that includes one or more initiators that are capable of generating free radicals sufficient to initiate polymerization of all the various free radically polymerizable components upon exposure of the composition to imaging radiation. The initiator composition is generally responsive to imaging radiation corresponding to the spectral range of from about 150 to about 450 nm or of at least 700 nm and up to and including 1400 nm (typically from about 700 to about 1250 nm). Initiator compositions are used that are appropriate for the desired imaging wavelength(s).

Useful initiators compositions include but are not limited to, one or more compounds chosen from any of the following classes of compounds (A) through (H) described below, or one or more compounds from multiple classes of compounds:

(A) Metallocenes are organometallic compounds having one or more cyclopentadienyl ligands that are optionally substituted at one or all of the ring carbons. Each carbon in the five-member ligand ring is coordinated to the transition metal center. Metallocenes are known for having a wide variety of transition metals including iron, titanium, tungsten, molybdenum, nickel, cobalt, chromium, zirconium, and manganese.

(B) Azines, for example, as described for example in U.S. Pat. No. 6,936,384 (Munnelly et al.). These compounds are organic heterocyclic compounds containing a 6-membered ring formed from carbon and nitrogen atoms. Azine compounds include heterocyclic groups such as pyridine, diazine, and triazine groups, as well as polycyclic compounds having a pyridine, diazine, or triazine substituent fused to one or more aromatic rings such as carbocyclic aromatic rings. Thus, the azine compounds include, for example, compounds having a quinoline, isoquinoline, benzodiazine, or naphthodiazine substituent. Both monocyclic and polycyclic azine compounds are useful. Halomethyl-substituted triazines, such as trihalomethyl triazines, are useful in the initiator composition. Representative compounds of this type include but are not limited to, 1,3,5-triazine derivatives such as those having 1 to 3 —$CX_3$ groups wherein X independently represent chlorine or bromine atoms, including polyhalomethyl-substituted triazines and other triazines.

(C) Peroxides such as benzoyl peroxide and hydroperoxides such as cumyl hydroperoxide and other organic peroxides described for example in EP 1,035,435 (Sorori et al.).

(D) 2,4,5-Triarylimidazolyl dimers (also known as hexaarylbiimidazoles, or "HABI's") as described for example in U.S. Pat. No. 4,565,769 (Dueber et al.). Examples of such compounds include but are not limited to, 2,2'-bis(o-chlorophenyl)-4,4',5,5'-tetraphenylbiimidazole and 2,2'-bis(o-chlorophenyl)-4,4'5,5'-tetra(m-methoxyphenyl)biimidazole. Other useful "HABI's" are described by formula (V) and the listed examples on pages 25-27 of WO 07/090550 (Strehmel et al.).

(E) Onium salts such as ammonium, iodonium, sulfonium salts, phosphonium, oxylsulfoxonium, oxysulfonium, diazonium, selenonium, arsenonium, and pyridinium salts. Useful iodonium salts are well known in the art and include but not limited to, U.S. Patent Application Publication 2002/0068241 (Oohashi et al.), WO 2004/101280 (Munnelly et al.), and U.S. Pat. No. 5,086,086 (Brown-Wensley et al.), U.S. Pat. No. 5,965,319 (Kobayashi), and U.S. Pat. No. 6,051,366 (Baumann et al.). The onium salts generally include a suitable number of negatively-charged counterions such as halides, hexafluorophosphate, thiosulfate, hexafluoroantimonate, tetrafluoroborate, sulfonates, hydroxide, perchlorate, n-butyltriphenyl borate, tetraphenyl borate, and others readily apparent to one skilled in the art. Halonium salts are useful onium salts.

(F) Oxime esters or oxime ethers such as those derived from benzoin.

(G) N-phenyl glycine and derivatives thereof including compounds that have additional carboxy groups and can be considered polycarboxylic acids or anilino diacetic acids. Examples of such compounds include but are not limited to, N-phenylglycine and the glycine derivatives described in [0054] of WO 03/066338 (Timpe et al.).

(H) Thiol compounds such as heterocyclic mercapto compounds including mercaptotriazoles, mercaptobenzimidazoles, mercaptooxadiazoles, methcaptotetrazines, mercaptoimidazoles, mercaptopyridines, mercaptooxazoles, mercaptobenzoxazoles, mercaptobenzothiazoles, mercaptobenzoxadiazoles, mercaptotetrazoles, such as those described for example in U.S. Pat. No. 6,884,568 (Timpe et al.).

In some embodiments, useful initiator compositions include a combination of a 2,4,5-triarylimidazolyl dimer and a thiol compound. Other useful initiator compositions can include an onium salt such as an iodonium salt as described above in combination with a metallocene.

Still other initiator compositions are responsive to radiation in the near-IR and IR regions, for example from about 700 to about 1400 nm. For example, useful iodonium cations are well known in the art including but not limited to, U.S. Patent Application Publication 2002/0068241 (Oohashi et al.), WO 2004/101280 (Munnelly et al.), and U.S. Pat. No. 5,086,086 (Brown-Wensley et al.), U.S. Pat. No. 5,965,319 (Kobayashi), and U.S. Pat. No. 6,051,366 (Baumann et al.). For example, a useful iodonium cation includes a positively charged iodonium, (4-methylphenyl)[4-(2-methylpropyl)phenyl]-moiety and a suitable negatively charged counterion. A representative example of such an iodonium salt is available as Irgacure® 250 from Ciba Specialty Chemicals (Tarrytown, N.Y.) that is (4-methylphenyl)[4-(2-methylpropyl)phenyl]iodonium hexafluorophosphate and is supplied in a 75% propylene carbonate solution.

Thus, the iodonium cations can be supplied as part of one or more iodonium salts, and as described below, the iodonium cations can be supplied as iodonium borates also containing suitable boron-containing anions. For example, the iodonium cations and the boron-containing anions can be supplied as part of substituted or unsubstituted diaryliodonium salts that are combinations of Structures (I) and (II) described in Cols. 6-8 of U.S. Pat. No. 7,524,614 (Tao et al.) that is incorporated herein by reference.

The iodonium cations and boron-containing anions are generally present in the imagable layer in a combined amount of at least 1% and up to and including 15%, and typically at least 4 and up to and including about 10%, based on total dry weight of the imagable layer.

The radiation-sensitive composition (and imagable element) can include one or more imaging radiation absorbing chromophores, or sensitizers, that spectrally sensitize the composition to a wavelength of from about 150 nm and up to and including 450 nm, typically from about 350 to about 450 nm, and more typically from about 390 to about 430 nm.

Useful sensitizers include but are not limited to, certain pyrilium and thiopyrilium dyes and 3-ketocoumarins. Some other useful sensitizers for such spectral sensitivity are described for example, in U.S. Pat. No. 6,908,726 (Korionoff et al.), WO 2004/074929 (Baumann et al.) that describes useful bisoxazole derivatives and analogues, and U.S. Patent Application Publications 2006/0063101 and 2006/0234155 (both Baumann et al.).

Still other useful sensitizers are the oligomeric or polymeric compounds having Structure (I) units defined in WO 2006/053689 (Strehmel et al.) that have a suitable aromatic or heteroaromatic unit that provides a conjugated π-system between two heteroatoms. Additional useful "violet"-visible radiation sensitizers are the compounds described in WO 2004/074929 (Baumann et al.). These compounds comprise the same or different aromatic heterocyclic groups connected with a spacer moiety that comprises at least one carbon-carbon double bond that is conjugated to the aromatic heterocyclic groups, and are represented in more detail by Formula (I) of the noted publication. Other useful sensitizers are the 2,4,5-triaryloxazole derivatives as described in WO 2004/074930 (Baumann et al.).

EP 684,522 (Baumann et al.) describes radiation-sensitive compositions and imagable elements containing one or more dyes that have a spectral absorption in the range of from about 250 nm to about 700 nm.

The UV sensitizer can be present in the radiation-sensitive composition in an amount generally of at least 1% and up to and including 30% and typically at least 3 and up to and including 20.

Useful IR radiation absorbing chromophores include various IR-sensitive dyes ("IR dyes"). Examples of suitable IR dyes comprising the desired chromophore include but are not limited to, azo dyes, squarilium dyes, croconate dyes, triarylamine dyes, thioazolium dyes, indolium dyes, oxonol dyes, oxaxolium dyes, cyanine dyes, merocyanine dyes, phthalocyanine dyes, indocyanine dyes, indotricarbocyanine dyes, oxatricarbocyanine dyes, thiocyanine dyes, thiatricarbocyanine dyes, merocyanine dyes, cryptocyanine dyes, naphthalocyanine dyes, polyaniline dyes, polypyrrole dyes, polythiophene dyes, chalcogenopyryloarylidene and bi(chalcogenopyrylo)polymethine dyes, oxyindolizine dyes, pyrylium dyes, pyrazoline azo dyes, oxazine dyes, naphthoquinone dyes, anthraquinone dyes, quinoneimine dyes, methine dyes, arylmethine dyes, squarine dyes, oxazole dyes, croconine dyes, porphyrin dyes, and any substituted or ionic form of the preceding dye classes. Suitable dyes are also described in U.S. Pat. No. 4,973,572 (DeBoer et al.), U.S. Pat. No. 5,208,135 (Patel et al.), U.S. Pat. No. 6,153,356 (Urano et al.), U.S. Pat. No. 6,264,920 (Achilefu et al.), U.S. Pat. No. 6,309,792 (Hauck et al.), and U.S. Pat. No. 6,787,281 (Tao et al.), and EP 1,182,033A2 (noted above). Infrared radiation absorbing N-alkylsulfate cyanine dyes are described for example in U.S. Pat. No. 7,018,775 (Tao).

A general description of one class of suitable cyanine dyes is shown by the formula in paragraph [0026] of WO 2004/101280 (Munnelly et al.).

In addition to low molecular weight IR-absorbing dyes, IR dye chromophores bonded to polymers can be used as well. Moreover, IR dye cations can be used as well, that is, the cation is the IR absorbing portion of the dye salt that ionically interacts with a polymer comprising carboxy, sulfo, phospho, or phosphono groups in the side chains.

Suitable dyes may be formed using conventional methods and starting materials or obtained from various commercial sources including American Dye Source (Baie D'Urfe, Quebec, Canada) and FEW Chemicals (Germany).

Some useful infrared radiation absorbing dyes have a tetraaryl pentadiene chromophore. Such chromophores generally include a substituted or unsubstituted pentadiene linking group having 5 carbon atoms in the chain, to which are attached two substituted or unsubstituted aryl groups at each end of the linking group.

Useful infrared radiation absorbing dyes can also be obtained from a number of commercial sources including Showa Denko (Japan) or they can be prepared using known starting materials and procedures.

Still other useful infrared radiation absorbing compounds are copolymers can comprise covalently attached ammonium, sulfonium, phosphonium, or iodonium cations and infrared radiation absorbing cyanine anions that have two or four sulfonate or sulfate groups, or infrared radiation absorbing oxonol anions, as described for example in U.S. Pat. No. 7,049,046 (Tao et al.).

The infrared radiation absorbing compounds can be present in the IR-sensitive composition (or imagable layer) in an amount generally of at least 1% and up to and including 30% and typically at least 3 and up to and including 20%, based on total solids in the composition, that also corresponds to the total dry weight of the imagable layer. The particular amount needed for this purpose would be readily apparent to one skilled in the art, depending upon the specific compound used to provide the desired chromophore.

The radiation-sensitive composition includes one or more polymeric binders that are generally used for off-press developability include any alkaline solution soluble (or dispersible) polymer having an acid value of from about 20 to about 400 (typically from about 30 to about 200). The following described polymeric binders are useful in this manner but this is not an exhaustive list:

I. Polymers formed by polymerization of a combination or mixture of (a) (meth)acrylonitrile, (b) poly(alkylene oxide) esters of (meth)acrylic acid, and optionally (c) (meth)acrylic acid, (meth)acrylate esters, styrene and its derivatives, and (meth)acrylamide as described for example in U.S. Pat. No. 7,326,521 (Tao et al.) that is incorporated herein by reference. Some particularly useful polymeric binders in this class are derived from one or more (meth)acrylic acids, (meth)acrylate esters, styrene and its derivatives, vinyl carbazoles, and poly(alkylene oxide)(meth)acrylates.

II. Polymers having pendant allyl ester groups as described in U.S. Pat. No. 7,332,253 (Tao et al.) that is incorporated herein by reference. Such polymers may also include pendant cyano groups or have recurring units derived from a variety of other monomers as described in Col. 8, line 31 to Col. 10, line 3 of the noted patent.

III. Polymers having all carbon backbones wherein at least 40 and up to 100 mol % (and typically from about 40 to about 50 mol %) of the carbon atoms forming the all carbon backbones are tertiary carbon atoms, and the remaining carbon atoms in the all carbon backbone being non-tertiary carbon atoms. By "tertiary carbon", we refer to a carbon atom in the all carbon backbone that has three valences filled with radicals or atoms other than a hydrogen atom (which fills the fourth valence). By "non-tertiary carbon", we mean a carbon atom in the all carbon backbone that is a secondary carbon (having two valences filled with hydrogen atoms) or a quaternary carbon (having no hydrogen atoms attached). Typically, most of the non-tertiary carbon atoms are secondary carbon atoms.

Representative recurring units comprising tertiary carbon atoms can be derived from one or more ethylenically unsaturated polymerizable monomers selected from vinyl carbazole, styrene and derivatives thereof (other than divinylbenzene and similar monomers that provide pendant carbon-carbon polymerizable groups), acrylic acid, acrylonitrile, acrylamides, acrylates, and methyl vinyl ketone. As noted above, two or more different recurring units can be used. Similarly, representative recurring units with secondary or quaternary carbon atoms can be derived from one or more ethylenically unsaturated polymerizable monomers selected from methacrylic acid, methacrylates, methacrylamides, and α-methylstyrene.

IV. Polymeric binders that have one or more ethylenically unsaturated pendant groups (reactive vinyl groups) attached to the polymer backbone. Such reactive groups are capable of undergoing polymerizable or crosslinking in the presence of free radicals. The pendant groups can be directly attached to the polymer backbone with a carbon-carbon direct bond, or through a linking group ("X") that is not particularly limited. The reactive vinyl groups may be substituted with at least one halogen atom, carboxy group, nitro group, cyano group, amide group, or alkyl, aryl, alkoxy, or aryloxy group, and particularly one or more alkyl groups. In some embodiments, the reactive vinyl group is attached to the polymer backbone through a phenylene group as described, for example, in U.S. Pat. No. 6,569,603 (Furukawa et al.) that is incorporated herein by reference. Other useful polymeric binders have vinyl groups in pendant groups that are described, for example in EP 1,182,033A1 (Fujimaki et al.) and U.S. Pat. No. 4,874,686 (Urabe et al.), U.S. Pat. No. 7,729,255 (Tao et al.), U.S. Pat. No. 6,916,595 (Fujimaki et al.), and U.S. Pat. No. 7,041,416 (Wakata et al.) that are incorporated by reference, especially with respect to the general formulae (1) through (3) noted in EP 1,182,033A1.

V. Polymeric binders can have pendant 1H-tetrazole groups as described in U.S. Application Publication 2009/0142695 (noted above) that is incorporated herein by reference.

VI. Still other useful polymeric binders may be homogenous, that is, dissolved in the coating solvent, or may exist as discrete particles and include but are not limited to, (meth)acrylic acid and acid ester resins [such as (meth)acrylates], polyvinyl acetals, phenolic resins, polymers derived from styrene, N-substituted cyclic imides or maleic anhydrides, such as those described in EP 1,182,033 (noted above) and U.S. Pat. No. 6,309,792 (Hauck et al.), U.S. Pat. No. 6,352,812 (Shimazu et al.), U.S. Pat. No. 6,569,603 (noted above), and U.S. Pat. No. 6,893,797 (Munnelly et al.). Also useful are the vinyl carbazole polymers described in U.S. Pat. No. 7,175,949 (Tao et al.). Copolymers of polyethylene glycol methacrylate/acrylonitrile/styrene in particulate form, dissolved copolymers derived from carboxyphenyl methacrylamide/acrylonitrile/-methacrylamide/N-phenyl maleimide, copolymers derived from polyethylene glycol methacrylate/acrylonitrile/vinyl carbazole/styrene/methacrylic acid, copolymers derived from N-phenyl maleimide/methacrylamide/methacrylic acid, copolymers derived from urethane-acrylic intermediate A (the reaction product of p-toluene sulfonyl isocyanate and hydroxyl ethyl methacrylate)/acrylonitrile/N-phenyl maleimide, and copolymers derived from N-methoxymethyl methacrylamide/methacrylic acid/acrylonitrile/n-phenyl maleimide are useful.

Other useful polymeric binders are particulate poly(urethane-acrylic) hybrids that are distributed (usually uniformly) throughout the imagable layer. Some poly(urethane-acrylic) hybrids are commercially available in dispersions from Air Products and Chemicals, Inc. (Allentown, Pa.), for example, as the Hybridur® 540, 560, 570, 580, 870, 878, 880 polymer dispersions of poly (urethane-acrylic) hybrid particles.

The polymeric binder is generally present in the radiation-sensitive composition (and imagable layer) in an amount of at least 5 and up to 70 weight %, and typically from about 10 to about 50 weight % based on the total solids in the composition and layer.

The radiation-sensitive composition (imagable layer) can further comprise one or more phosphate(meth)acrylates each of which has a molecular weight generally greater than 200 and typically at least 300 and up to and including 1000. By "phosphate(meth)acrylate" we also mean to include "phosphate methacrylates" and other derivatives having substituents on the vinyl group in the acrylate moiety. Such compounds and their use in imagable layers are described in more detail in U.S. Pat. No. 7,175,969 (Ray et al.) that is incorporated herein by reference.

Additional additives to the imagable layer include color developers or acidic compounds. As color developers, we mean to include monomeric phenolic compounds, organic acids or metal salts thereof, oxybenzoic acid esters, acid clays, and other compounds described for example in U.S. Patent Application Publication 2005/0170282 (Inno et al.).

The imagable layer can also include a variety of optional compounds including but not limited to, dispersing agents, humectants, biocides, plasticizers, surfactants for coatability or other properties, viscosity builders, pH adjusters, drying agents, defoamers, preservatives, antioxidants, development aids, rheology modifiers or combinations thereof, or any other addenda commonly used in the lithographic art, in conventional amounts. Useful viscosity builders include hydroxypropyl cellulose, hydroxyethyl cellulose, carboxymethyl cellulose, and poly(vinyl pyrrolidones).

The negative-working lithographic printing plate precursors can be formed by suitable application of a radiation-sensitive composition as described above to a suitable substrate to form an imagable layer. This substrate can be treated or coated in various ways as described below prior to application of the radiation-sensitive composition to improve hydrophilicity. Typically, there is only a single imagable layer comprising the radiation-sensitive composition.

The element can also include what is conventionally known as an overcoat (or an oxygen impermeable topcoat) applied to and disposed over the imagable layer for example, as described in WO 99/06890 (Pappas et al.). Such topcoats generally comprise one or more hydrophilic or water-soluble polymers such as a poly(vinyl alcohol), poly(vinyl pyrrolidone), poly(ethyleneimine), or poly(vinyl imidazole), copolymers of two or more of vinyl pyrrolidone, ethyleneimine, and vinyl imidazole in an amount of at least 50 weight % (or at least 90 weight %) based on total topcoat dry weight. The topcoat generally has a dry coating weight of from about 0.2 to about 2.5 g/m² or from about 0.5 to about 2 g/m², in which the water-soluble polymer(s) comprise at least 50% and up to 100% of the dry weight of the overcoat. However, at noted above, the crosslinked polymeric particles having grafted hydrophilic polymeric groups can be present in the topcoat in an amount of at least 0.001 g/m² that can represent at least 0.5% solids of the topcoat dry weight. A poly(vinyl alcohol) can be the predominant polymeric binder (at least 50 weight % of total binders).

The substrate generally has a hydrophilic surface, or at least a surface that is more hydrophilic than the applied radiation-sensitive composition on the imaging side. The substrate comprises a support that can be composed of any material that is conventionally used to prepare imagable elements such as lithographic printing plates. It is usually in the form of a sheet, film, or foil (or web), and is strong, stable, and flexible and resistant to dimensional change under conditions of use. Typically, the support can be any self-supporting aluminum-containing material including aluminum sheets.

One useful substrate is composed of an aluminum support that may be treated using techniques known in the art, including roughening of some type by physical (mechanical) graining, electrochemical graining, or chemical graining, usually followed by acid anodizing. The aluminum support can be roughened by physical or electrochemical graining and then anodized using phosphoric or sulfuric acid and conventional procedures. A useful substrate is an electrochemically grained and phosphoric acid anodized aluminum support that provides a hydrophilic surface for lithographic printing.

An interlayer may be formed by treatment of the aluminum support with, for example, a silicate, dextrine, calcium zirconium fluoride, hexafluorosilicic acid, poly(vinyl phosphonic acid) (PVPA), vinyl phosphonic acid copolymer, poly[(meth)acrylic acid], poly(acrylic acid), or an acrylic acid copolymer to increase hydrophilicity. Still further, the aluminum support may be treated with a phosphate solution that may further contain an inorganic fluoride (PF). The aluminum support can be electrochemically-grained, phosphoric acid-anodized, and treated with poly(acrylic acid) using known procedures to improve surface hydrophilicity.

The thickness of the substrate can be varied but should be sufficient to sustain the wear from printing and thin enough to wrap around a printing form. Useful embodiments include a treated aluminum foil having a thickness of at least 100 μm and up to and including 700 μm. The substrate can also be a cylindrical aluminum surface having the radiation-sensitive composition applied thereon, and thus be an integral part of the printing press. The use of such imaging cylinders is described for example in U.S. Pat. No. 5,713,287 (Gelbart).

The radiation-sensitive composition can be applied to the substrate as a solution or dispersion in a coating liquid using any suitable equipment and procedure, such as spin coating, knife coating, gravure coating, die coating, slot coating, bar coating, wire rod coating, roller coating, or extrusion hopper coating. The composition can also be applied by spraying onto a suitable support (such as an on-press printing cylinder). Typically, the radiation-sensitive composition is applied and dried to form an imagable layer and an overcoat formulation is applied to that layer.

Illustrative of such manufacturing methods is mixing the radically polymerizable component, polymeric binder, initiator composition, radiation absorbing compound, optional crosslinked polymeric particles, and any other components of the radiation-sensitive composition in a suitable organic solvent or mixtures thereof [such as methyl ethyl ketone (2-butanone), methanol, ethanol, 1-methoxy-2-propanol, iso-propyl alcohol, acetone, γ-butyrolactone, n-propanol, tetrahydrofuran, and others readily known in the art, as well as mixtures thereof], applying the resulting solution to a substrate, and removing the solvent(s) by evaporation under suitable drying conditions. Some representative coating solvents and imagable layer formulations are described in the Examples below. After proper drying, the coating weight of the imagable layer is generally at least 0.1 and up to and including 5 $g/m^2$ or at least 0.5 and up to and including 3.5 $g/m^2$.

Layers can also be present under the imagable layer to enhance developability or to act as a thermal insulating layer.

The various layers may be applied by conventional extrusion coating methods from melt mixtures of the respective layer compositions. Typically such melt mixtures contain no volatile organic solvents.

Intermediate drying steps may be used between applications of the various layer formulations to remove solvent(s) before coating other formulations. Drying steps at conventional times and temperatures may also help in preventing the mixing of the various layers.

Once the various layers have been applied and dried on the substrate, the negative-working lithographic printing plate precursor can be enclosed in water-impermeable material that substantially inhibits the transfer of moisture to and from the precursor as described in U.S. Pat. No. 7,175,969 (noted above) that is incorporated herein by reference.

Imaging and development of the negative-working lithographic printing plate precursors would be readily known to a worker of ordinary skill in the art (see below).

In many embodiments of the invention, the stack of imagable elements has at least 5 and from 20 to 1000 negative-working lithographic printing plate precursors, or at least 100 of them, or more likely at least 500 of the precursors.

Positive-Working Lithographic Printing Plate Precursors

The lithographic printing plate precursors can also be single- or multi-layer, thermally-sensitive, positive-working imagable elements that generally rely on a radiation absorbing compound dispersed within one or more polymeric binders that, upon suitable irradiation, are soluble, dispersible, or removable in processing solutions including alkaline developers. Thus, the imagable layer, upon irradiation, undergoes a change in solubility properties with respect to the processing solution in its irradiated (exposed) regions.

For example, "single-layer" positive-working imagable elements are described for example, in WO 2004/081662 (Memetea et al.), U.S. Pat. No. 6,255,033 (Levanon et al.), U.S. Pat. No. 6,280,899 (Hoare et al.), U.S. Pat. No. 6,485,890 (Hoare et al.), U.S. Pat. No. 6,558,869 (Hearson et al.), U.S. Pat. No. 6,706,466 (Parsons et al.), U.S. Pat. No. 6,541,181 (Levanon et al.), U.S. Pat. No. 7,223,506 (Kitson et al.), U.S. Pat. No. 7,247,418 (Saraiya et al.), U.S. Pat. No. 7,270,930 (Hauck et al.), U.S. Pat. No. 7,279,263 (Goodin), and U.S. Pat. No. 7,399,576 (Levanon), EP 1,627,732 (Hatanaka et al.), and U.S. Published Patent Applications 2005/0214677 (Nagashima), 2004/0013965 (Memetea et al.), 2005/0003296 (Memetea et al.), and 2005/0214678 (Nagashima).

In general, single-layer imagable elements are formed by suitable application of an imagable layer formulation containing one or more polymeric binders to a suitable substrate (described above) to form an imagable layer. The substrate can be treated to provide an "interlayer" for improved adhesion or hydrophilicity, and the single imagable layer is applied over the interlayer.

The single-layer, positive-working imagable element also includes one or more radiation absorbing compounds (described above). While these compounds can be sensitive to any suitable energy form (including UV or visible radiation), they are usually sensitive to near-infrared or infrared radiation and thus, the radiation absorbing compounds having spectral sensitivity to from about 700 to about 1400 nm and typically from about 750 to about 1250 nm. Examples of suitable infrared radiation-sensitive compounds, including IR dyes are described above in relation to the negative-working imagable elements.

The radiation absorbing compound is generally present in the imagable element in an amount sufficient to render the imagable layer insoluble to an aqueous developer after exposure to appropriate radiation. This amount is generally at least 0.5% and up to 30 weight % and typically from about 3 to about 10 weight % (based on total dry layer weight). In most embodiments, the radiation absorbing compound is present in the single imagable layer. Alternatively or additionally, radiation absorbing compounds may be located in a separate non-imagable layer that is in thermal contact with the single imagable layer.

In addition, solubility-suppressing components are optionally incorporated into the single imagable layer. Such components act as dissolution inhibitors that function as solubility-suppressing components for the polymeric binders. Dissolution inhibitors typically have polar functional groups that are believed to act as acceptor sites for hydrogen bonding with various groups in the polymeric binders. The acceptor sites comprise atoms with high electron density, and can be selected from electronegative first row elements such as carbon, nitrogen, and oxygen. Dissolution inhibitors that are soluble in the alkaline developer are useful. Further details and representative compounds useful as dissolution inhibitors are described for example in U.S. Pat. No. 6,294,311 (noted above). Useful dissolution inhibitors include triarylmethane dyes such as ethyl violet, crystal violet, malachite green, brilliant green, Victoria blue B, Victoria blue R, and Victoria pure blue BO, BASONYL® Violet 610 and D11 (PCAS, Longjumeau, France).

The polymeric binders used in the imagable layer are generally soluble in alkaline developers (defined below) after thermal imaging. The polymer(s) are present in an amount of at least 10 weight % and typically from about 20 to about 80 weight % of the total dry imagable layer weight.

Useful polymeric binders can be poly(vinyl phenols) or derivatives thereof, or phenolic polymers. They may include carboxylic (carboxy), sulfonic (sulfo), phosphonic (phosphono), or phosphoric acid groups that are incorporated into the polymer molecule. Other useful additional polymers include but are not limited to, novolak resins, resole resins, poly(vinyl acetals) having pendant phenolic groups, and mixtures of any of these resins (such as mixtures of one or more novolak resins and one or more resole resins). For example, some useful novolak resins include but are not limited to, xylenol-cresol resins, for example, SPN400, SPN420, SPN460, and VPN1100 (that are available from AZ Electronics) and EP25D40G and EP25D50G (noted below for the Examples) that have higher molecular weights, such as at least 4,000.

Other useful additional resins include polyvinyl compounds having phenolic hydroxyl groups, include poly(hydroxystyrenes) and copolymers containing recurring units of a hydroxystyrene and polymers and copolymers containing recurring units of substituted hydroxystyrenes. Also useful are branched poly(hydroxystyrenes) having multiple branched hydroxystyrene recurring units derived from 4-hydroxystyrene as described for example in U.S. Pat. No. 5,554,719 (Sounik) and U.S. Pat. No. 6,551,738 (Ohsawa et al.), and U.S. Published Patent Applications 2003/0050191 (Bhatt et al.) and 2005/0051053 (Wisnudel et al.), and in U.S. Patent Application Publication 2008/0008956 (Levanon et al.).

One group of useful polymeric binders are poly(vinyl phenol) and derivatives thereof. Such polymers are obtained generally by polymerization of vinyl phenol monomers, that is, substituted or unsubstituted vinyl phenols. Some vinyl phenol copolymers are described in EP 1,669,803A (Barclay et al.).

Other polymeric binders that may be in the imagable layer include phenolic resins such as novolak and resole resins, and such resins that include one or more pendant diazo, carboxylate ester, phosphate ester, sulfonate ester, sulfonate ester, or ether groups. The hydroxy groups of the phenolic resins can be converted to -T-Z groups in which T represents a polar group and Z represents a non-diazide functional group as described for example in U.S. Pat. No. 6,218,083 (McCullough et al.) and WO 99/001795 (McCullough et al.). The hydroxy groups can also be derivatized with diazo groups containing o-naphthoquinone diazide moieties as described for example in U.S. Pat. No. 5,705,308 (West et al.) and U.S. Pat. No. 5,705,322 (West et al.). Other useful binder resins include acrylate copolymers as described for example in EP 737,896A (Ishizuka et al.), cellulose esters and poly(vinyl acetals) as described for example in U.S. Pat. No. 6,391,524 (Yates et al.), DE 10 239 505 (Timpe et al.), and WO 2004081662 (Memetea et al.).

The single imagable layer can further include a variety of additives including dispersing agents, humectants, biocides, plasticizers, surfactants for coatability or other properties, viscosity builders, pH adjusters, drying agents, defoamers, preservatives, antioxidants, development aids, rheology modifiers, or combinations thereof, or any other addenda commonly used in the lithographic art, in conventional amounts.

The single-layer imagable element can be prepared by applying the layer formulation over the surface of the substrate (and any other hydrophilic layers provided thereon) using conventional coating or lamination methods. Thus, the formulations can be applied by dispersing or dissolving the desired ingredients in a suitable coating solvent, and the resulting formulations are sequentially or simultaneously applied to the substrate using suitable equipment and procedures, such as spin coating, knife coating, gravure coating, die coating, slot coating, bar coating, wire rod coating, roller coating, or extrusion hopper coating. The formulations can also be applied by spraying onto a suitable support (such as an on-press printing cylinder or printing sleeve).

The coating weight for the single imagable layer can be from about 0.5 to about 2.5 g/m$^2$ and typically from about 1 to about 2 g/m$^2$.

The selection of solvents used to coat the imagable layer formulation depends upon the nature of the polymeric materials and other components in the formulations. Generally, the imagable layer formulation is coated out of acetone, methyl ethyl ketone, or another ketone, tetrahydrofuran, 1-methoxypropan-2-ol, 1-methoxy-2-propyl acetate, and mixtures thereof using conditions and techniques well known in the art.

Other positive-working lithographic printing plate precursors comprise an aluminum-containing substrate (described above), an inner layer (also known as an "underlayer"), and an ink-receptive outer layer (also known as a "top layer" or "topcoat") disposed over the inner layer. Before thermal imaging, the outer layer is generally not soluble, dispersible, or removable by the processing solution within the usual time allotted for development, but after thermal imaging, the imaged regions of the outer layer are more readily removable by or dissolvable in the processing solution. The inner layer is also generally removable by the processing solution. An infrared radiation absorbing compound (defined below) is also present in the imagable element, and is typically present in the inner layer but may optionally be in a separate layer between the inner and outer layers.

Thermally imagable, multi-layer elements are described, for example, in U.S. Pat. No. 6,294,311 (Shimazu et al.), U.S. Pat. No. 6,352,812 (Shimazu et al.), U.S. Pat. No. 6,593,055 (Shimazu et al.), U.S. Pat. No. 6,352,811 (Patel et al.), U.S. Pat. No. 6,358,669 (Savariar-Hauck et al.), U.S. Pat. No. 6,528,228 (Savariar-Hauck et al.), U.S. Pat. No. 7,163,770 (Saraiya et al.), U.S. Pat. No. 7,163,777 (Ray et al.), U.S. Pat. No. 7,186,482 (Kitson et al.), U.S. Pat. No. 7,223,506 (noted above), U.S. Pat. No. 7,229,744 (Patel), U.S. Pat. No. 7,241,556 (Saraiya et al.), U.S. Pat. No. 7,247,418 (noted above), U.S. Pat. No. 7,291,440 (Ray et al.), U.S. Pat. No. 7,300,726 (Patel et al.), and U.S. Pat. No. 7,338,745 (Ray et al.), and U.S. Patent Application Publications 2004/0067432 A1 (Kitson et al.) and 2005/0037280 (Loccufier et al.).

Useful first polymeric binders for the inner layer include but are not limited to, (meth)acrylonitrile polymers, (meth)acrylic resins comprising pendant carboxy groups, polyvinyl acetals, maleated wood rosins, styrene-maleic anhydride copolymers, (meth)acrylamide polymers such as polymers derived from N-alkoxyalkyl methacrylamide, polymers derived from an N-substituted cyclic imide, polymers having pendant urea or cyclic urea groups, and combinations thereof. First polymeric binders that provide resistance both to fountain solution and aggressive washes are disclosed in U.S. Pat. No. 6,294,311 (noted above).

Useful first polymeric binders include (meth)acrylonitrile polymers, and polymers derived from an N-substituted cyclic imide (especially N-phenylmaleimide), a (meth)acrylamide (especially methacrylamide), a monomer having a pendant urea or cyclic urea group, and a (meth)acrylic acid (especially methacrylic acid). Other hydrophilic monomers, such as hydroxyethyl methacrylate, may be used in place of some or all of the methacrylamide. Other alkaline soluble monomers, such as acrylic acid, may be used in place of some or all of the methacrylic acid. Optionally, these polymers can also include recurring units derived from (meth)acrylonitrile or N-[2-(2-oxo-1-imidazolidinyl)ethyl]-methacrylamide.

Other useful first polymeric binders can comprise, in polymerized form, from about 5 mol % to about 30 mol % of recurring units derived from an ethylenically unsaturated polymerizable monomer having a carboxy group (such as acrylic acid, methacrylic acid, itaconic acid, and other similar monomers known in the art (acrylic acid and methacrylic acid are preferred), from about 20 mol % to about 75 mol % of recurring units derived from N-phenylmaleimide, N-cyclohexylmaleimide, or a mixture thereof.

Additional useful polymeric binders for the inner layer are described for example, in U.S. Pat. No. 7,144,661 (Ray et al.), U.S. Pat. No. 7,163,777 (Ray et al.), and U.S. Pat. No. 7,223,506 (Kitson et al.), and U.S. Patent Application Publications 2006/0257764 (Ray et al.) and 2007/0172747 (Ray et al.).

In some embodiments, the inner layer (and typically only the inner layer) further comprises an infrared radiation absorbing compound ("IR absorbing compounds") that absorbs radiation from about at 600 nm to about 1500 and typically from about at 750 nm to about 1250 nm, with minimal absorption at from about 300 to about 600 nm, as described above.

The infrared radiation absorbing compound can be present in the imagable element in an amount of generally from about 5% to about 30% and typically from about 12 to about 25%, based on the total dry weight of the element. This amount is based on the total dry weight of the layer in which it is located.

The inner layer can include other components such as surfactants, dispersing aids, humectants, biocides, viscosity builders, drying agents, defoamers, preservatives, antioxidants, colorants, or organic or inorganic particles.

The inner layer generally has a dry coating coverage of from about 0.5 to about 2.5 g/m$^2$ and typically from about 1 to about 2 g/m$^2$. The total polymeric binders described above generally comprise at least 50 weight % and typically from about 60 to about 90 weight % based on the total dry layer weight, and this amount can be varied depending upon what other polymers and chemical components are present.

The ink-receptive outer layer of the imagable element is disposed over the inner layer and in typical embodiments there are no intermediate layers between the inner and outer layers. The outer layer comprises a polymeric material that is different than the first polymeric binder described above. The outer layer is generally free of infrared radiation absorbing compounds, meaning that none of these compounds are purposely incorporated therein and insubstantial amounts diffuse into it from other layers.

Thus, the outer layer comprises a polymeric binder that is a light-stable, water-insoluble, alkaline developer soluble, film-forming binder material such as phenolic resins, urethane resins, and polyacrylates. Particularly useful binder materials are described, for example in U.S. Pat. No. 6,352,812 (noted above), U.S. Pat. No. 6,358,669 (noted above), U.S. Pat. No. 6,352,811 (noted above), U.S. Pat. No. 6,294,311 (noted above), U.S. Pat. No. 6,893,783 (Kitson et al.), and U.S. Pat. No. 6,645,689 (Jarek), U.S. Patent Application Publications 2003/0108817 (Patel et al) and 2003/0162126 (Kitson et al.), and WO 2005/018934 (Kitson et al.).

Other useful film-forming polymeric binders for the outer layer are phenolic resins or hydroxy-containing polymers containing phenolic monomeric units that can be random, alternating, block, or graft copolymers of different monomers and may be selected from polymers of vinyl phenol, novolak resins, or resole resins.

Useful poly(vinyl phenol) resins can be polymers of one or more hydroxyphenyl containing monomers such as hydroxystyrenes and hydroxyphenyl(meth)acrylates. Other monomers not containing hydroxy groups can be copolymerized with the hydroxy-containing monomers. These resins can be prepared by polymerizing one or more of the monomers in the presence of a radical initiator or a cationic polymerization initiator using known reaction conditions.

Examples of useful hydroxy-containing polymers include ALNOVOL SPN452, SPN400, HPN100 (Clariant GmbH), DURITE PD443, SD423A, SD126A, PD494A, PD-140 (Hexion Specialty Chemicals, Columbus, Ohio), BAKELITE 6866LB02, AG, 6866LB03 (Bakelite AG), KR 400/8 (Koyo Chemicals Inc.), HRJ 1085 and 2606 (Schenectady International, Inc.), and Lyncur CMM (Siber Hegner), all of which are described in U.S. Patent Application Publication 2005/0037280 (noted above).

Useful novolak resins in the upper layer can be non-functionalized, or functionalized with polar groups including but not limited to, diazo groups, carboxylic acid esters (such as acetate benzoate), phosphate esters, sulfonate esters, sulfonate esters (such as methyl sulfonate, phenyl sulfonate, tosylate, 2-nitrobenzene tosylate, and p-bromophenyl sulfonate), and ethers (such as phenyl ethers). The phenolic hydroxyl groups can be converted to -T-Z groups in which "T" is a polar group and "Z" is another non-diazide functional group (as described for example in WO 99/01795 of McCullough et al. and U.S. Pat. No. 6,218,083 of McCullough et al.). The phenolic hydroxyl groups can also be derivatized with diazo groups containing o-naphthoquinone diazide moieties (as described for example in U.S. Pat. Nos. 5,705,308 and 5,705,322 both of West et al.).

Useful polymeric binders in the outer layer include copolymers described in U.S. Patent Application Publication 2007/0065737 (Kitson et al.).

The outer layer can also include non-phenolic polymeric materials as film-forming binder materials in addition to or instead of the phenolic resins described above. Such non-phenolic polymeric materials include polymers formed from maleic anhydride and one or more styrenic monomers (that is styrene and styrene derivatives having various substituents on the benzene ring), polymers formed from methyl methacrylate and one or more carboxy-containing monomers, and mixtures thereof.

In some embodiments, the outer layer may further include a monomeric or polymeric compound that includes a benzoquinone diazide and/or naphthoquinone diazide moiety. The polymeric compounds can be phenolic resins derivatized with a benzoquinone diazide and/or naphthoquinone diazide moiety as described for example in U.S. Pat. No. 5,705,308 (West et al.) and U.S. Pat. No. 5,705,322 (West et al.).

The outer layer generally has a dry coating coverage of from about 0.2 to about 2 g/m² and typically from about 0.4 to about 1.5 g/m².

There may be a separate layer that is between and in contact with the inner and outer layers. This separate layer can act as a barrier to minimize migration of radiation absorbing compound(s) from the inner layer to the outer layer. This separate "barrier" layer generally comprises other polymeric binders that are soluble in the alkaline developer. A useful polymeric binder is a poly(vinyl alcohol).

The multi-layer imagable element can be prepared by sequentially applying an inner layer formulation over the surface of the hydrophilic substrate (and any other hydrophilic layers provided thereon), and then applying an outer layer formulation over the inner layer using conventional coating or lamination methods. It is important to avoid intermixing of the inner and outer layer formulations.

The inner and outer layers can be applied by dispersing or dissolving the desired ingredients in a suitable coating solvent, and the resulting formulations are sequentially or simultaneously applied to the substrate using suitable equipment and procedures, such as spin coating, knife coating, gravure coating, die coating, slot coating, bar coating, wire rod coating, roller coating, or extrusion hopper coating. The formulations can also be applied by spraying onto a suitable support.

The selection of solvents used to coat both the inner and outer layers depends upon the nature of the first and second polymeric binders, other polymeric materials, and other components in the formulations. To prevent the inner and outer layer formulations from mixing or the inner layer from dissolving when the outer layer formulation is applied, the outer layer formulation should be coated from a solvent in which the first polymeric binder(s) of the inner layer are insoluble.

Generally, the inner layer formulation is coated out of a solvent mixture of methyl ethyl ketone (MEK), 1-methoxy-2-propyl acetate (PMA), γ-butyrolactone (BLO), and water, a mixture of MEK, BLO, water, and 1-methoxypropan-2-ol (also known as Dowanol® PM or PGME), a mixture of diethyl ketone (DEK), water, methyl lactate, and BLO, a mixture of DEK, water, and methyl lactate, or a mixture of methyl lactate, methanol, and dioxolane.

The outer layer formulation can be coated out of solvents or solvent mixtures that do not dissolve the inner layer. Typical solvents for this purpose include but are not limited to, butyl acetate, iso-butyl acetate, methyl iso-butyl ketone, DEK, 1-methoxy-2-propyl acetate (PMA), iso-propyl alcohol, PGME and mixtures thereof. Particularly useful is a mixture of DEK and PMA, or a mixture of DEK, PMA, and isopropyl alcohol.

After drying the layers, the lithographic printing plate precursor can be further "conditioned" with a heat treatment at from about 40 to about 90° C. for at least 4 hours (for example, at least 20 hours) under conditions that inhibit the removal of moisture from the dried layers. For example, the heat treatment is carried out at from about 50 to about 70° C. for at least 24 hours. During the heat treatment, the precursor is wrapped or encased in a water-impermeable sheet material to represent an effective barrier to moisture removal from the precursor, or the heat treatment of the imagable element is carried out in an environment in which relative humidity is controlled to at least 25%. In addition, the water-impermeable sheet material can be sealed around the edges of the imagable element, with the water-impermeable sheet material being a polymeric film or metal foil that is sealed around the edges of the precursor.

In some embodiments, this heat treatment can be carried out with a stack comprising at least 5 of the same lithographic printing plate precursors, or when the precursor is in the form of a coil or web. When conditioned in a stack, the individual precursors need not be separated by interleaving papers.

Imaging Conditions

The lithographic printing plate precursors can have any useful form and size or shape including but not limited to, flat printing plate precursors, printing cylinders, printing sleeves (both hollow or solid), and printing tapes (including flexible printing webs).

During use, the lithographic printing plate precursors are exposed to a suitable source of imaging or exposing radiation at a wavelength of from about 150 to about 1500 nm. For example, imaging can be carried out using imaging or exposing radiation, such as from an infrared laser at a wavelength of at least 700 nm and up to and including about 1400 nm and typically at least 750 nm and up to and including 1250 nm. Imaging can be carried out using imaging radiation at multiple wavelengths at the same time if desired. Other imagable elements, especially negative-working imagable elements can be exposed to a suitable source of UV, "violet", or visible imaging radiation.

Thus, in some embodiments, the lithographic printing plate precursors can have a spectral sensitivity to imagewise exposure that is carried out at a wavelength of from about 250 to about 475 nm, or to imagewise exposure that is carried out at a wavelength of from about 750 to about 1250 nm.

The laser used to expose the precursor is usually a diode laser, because of the reliability and low maintenance of diode laser systems, but other lasers such as gas or solid-state lasers may also be used. The combination of power, intensity and exposure time for laser imaging would be readily apparent to one skilled in the art.

The imaging apparatus can function solely as a platesetter or it can be incorporated directly into a lithographic printing press. In the latter case, printing may commence immediately after imaging and development, thereby reducing press set-up time considerably. The imaging apparatus can be configured as a flatbed recorder or as a drum recorder, with the imagable member mounted to the interior or exterior cylindrical surface of the drum. An example of an useful near-infrared and infrared imaging apparatus is available as models of Trendsetter or Quantum 800 imagesetters available from Eastman Kodak Company that contain laser diodes that emit near infrared radiation at a wavelength of about 830 nm. Other suitable imaging sources include the Crescent 42T Platesetter that operates at a wavelength of 1064 nm (available from Gerber Scientific, Chicago, Ill.) and the Screen PlateRite 4300 series or 8600 series platesetter (available from Screen, Chicago, Ill.). Additional useful sources of radiation include direct imaging presses that can be used to image an element while it is attached to the printing plate cylinder. An example of a suitable direct imaging printing press includes the Heidelberg SM74-DI press (available from Heidelberg, Dayton, Ohio).

Imaging with infrared radiation can be carried out generally at imaging energies of at least 30 mJ/cm² and up to and including 500 mJ/cm$^2$, and typically at least 50 and up to and including 300 mJ/cm$^2$ depending upon the sensitivity of the imagable layer.

Useful UV and "violet" imaging apparatus include Prosetter (from Heidelberger Druckmaschinen, Germany), Luxel V-8 (from FUJI, Japan), Python (Highwater, UK), MakoNews, Mako 2, Mako 4 or Mako 8 (from ECRM, US), Micra (from Screen, Japan), Polaris and Advantage (from AGFA, Belgium), Laserjet (from Krause, Germany), and Andromeda® A750M (from Lithotech, Germany), imagesetters.

Imaging radiation in the UV to visible region of the spectrum, and particularly the UV region (for example at least 250 nm and up to and including 450 nm), can be carried out generally using energies of at least 0.01 mJ/cm$^2$ and up to and including 0.5 mJ/cm$^2$, and typically at least 0.02 and up to and including about 0.1 mJ/cm$^2$. It would be desirable, for example, to image the UV/visible radiation-sensitive imagable elements at a power density in the range of at least 0.5 and up to and including 50 kW/cm$^2$ and typically of at least 5 and up to and including 30 kW/cm$^2$.

After imaging of negative-working lithographic printing plate precursors, a heating step may be used to accelerate the formation of a latent image. This heating step can be realized in so called "preheat units" that can be a separate machine or integrated into the processor that develops the imaged element. There are different types of preheat units. The most common ones use infrared radiation or hot air circulation, or combination thereof, to heat the imaged element. The temperature used for the purpose is from about 70 to about 200° C. and typically from about 90 to about 160° C.

Before developing the imaged precursor, a pre-rinse step may be carried out especially for the negative-working precursors having a protective oxygen barrier or topcoat. This pre-rinse step can be carried out in a stand-alone apparatus or by manually rinsing the imaged precursor with water or the pre-rinse step can be carried out in a washing unit that is integrated in a processor used for developing the imaged precursor.

Development and Printing

With or without the need for a preheat step after imaging, the imaged lithographic printing plate precursors can be developed "off-press" using conventional processing and an aqueous processing solution such as an aqueous developer.

As one skilled in the art would understand, the best developers for imaged negative-working precursors will likely be different than the best developers for the imaged single- or multi-layer positive-working precursors. A skilled worker would be able to determine from the level of skill and teaching in the art which developers are best with a given type of imaged precursor.

The processing solutions generally include surfactants, chelating agents (such as salts of ethylenediaminetetraacetic acid), organic solvents (such as benzyl alcohol), and alkaline components (such as inorganic metasilicates, organic metasilicates, hydroxides, and bicarbonates). The pH of such solutions is generally from about 4 to about 14. Aqueous alkaline developers and organic solvent-containing alkaline developers can be used.

Organic solvent-containing alkaline developers are generally single-phase solutions of one or more organic solvents that are miscible with water, and generally have a pH below 12. Useful organic solvents include the reaction products of phenol with ethylene oxide and propylene oxide [such as ethylene glycol phenyl ether(phenoxyethanol)], benzyl alcohol, esters of ethylene glycol and of propylene glycol with acids having 6 or less carbon atoms, and ethers of ethylene glycol, diethylene glycol, and of propylene glycol with alkyl groups having 6 or less carbon atoms, such as 2-ethylethanol and 2-butoxyethanol. The organic solvent(s) is generally present in an amount of from about 0.5 to about 15% based on total developer weight.

Representative organic solvent-containing alkaline developers include ND-1 Developer, 955 Developer, 956 Developer, 989 Developer, Developer 980, and 956 Developer (available from Eastman Kodak Company), HDN-1 Developer and LP-DS Developer (available from Fuji Photo), and EN 232 Developer and PL10 Developer (available from Agfa).

Useful aqueous alkaline developers generally have a pH of at least 7 and preferably of at least 11 and up to 13.5. Such developers include but are note limited to, 3000 Developer, 9000 Developer, Goldstar® Developer, Goldstar® Plus Developer, Goldstar® Premium Developer, GREENSTAR Developer, ThermalPro Developer, PROTHERM Developer, MX1813 Developer, and MX1710 Developer (all available from Eastman Kodak Company), as well as Fuji HDP7 Developer (Fuji Photo), and Energy CTP Developer (Agfa). These compositions also generally include surfactants, chelating agents (such as salts of ethylenediaminetetraacetic acid), and alkaline components (such as inorganic metasilicates, organic metasilicates, hydroxides, and bicarbonates).

Such alkaline developers can also include one or more "coating-attack suppressing agents" that are developer-soluble compounds that suppress developer attack of the outer layer. Examples of such compounds and representative sources, tradenames, or methods of preparing are described for example in U.S. Pat. No. 6,649,324 (Fiebag et al.).

Processing solutions having a pH of from about 4 to about 11 are also useful for developing imaged precursors in the absence of post-rinse and gumming steps after development (so called "single bath development"). Such processing solutions contain in most cases hydrophilic polymers like gum Arabic, polyvinyl alcohol, poly(acrylic acid), or other hydrophilic polymers to protect the developed plate against fingerprints and to prevent toning of the plate when used on a printing press.

Generally, a processing solution is applied to the imaged precursor by rubbing or wiping the outer layer with an applicator containing the developer. Alternatively, the imaged precursor can be brushed with the processing solution or it may be applied by spraying the outer layer with sufficient force to remove the exposed regions. Still again, the imaged precursor can be immersed in the procession solution. In all instances, a developed image is produced in a lithographic printing plate having excellent resistance to press room chemicals. These development processes can be carried out in suitable developing processors or equipment using standard residence times and recirculation and replenishment rates.

Following this off-press development, the resulting lithographic printing plate can be rinsed with water and dried in a suitable fashion. The dried printing plate can also be treated with a conventional gumming solution (preferably gum arabic). In addition, a postbake operation can be carried out, with or without a blanket exposure to UV or visible radiation. Alternatively, a post-UV floodwise exposure (without heat) can be used to enhance the performance of the printing plate.

In alternative embodiments, with or without a post-exposure baking step after imaging and before development, the imaged precursors can be developed "off-press" using a gum processing solution or single bath developer as described below. A gum solution is typically an aqueous liquid that comprises one or more surface protective compounds capable of protecting the lithographic image of the printing plate against contamination (for example, oxidation, fingerprints, dust or scratches). The gums useful in the practice of these embodiments would be generally considered "pre-bake" gums, and thus, usually lack the hydrophilic polymers.

The gum may be provided in diluted or concentrated form. The amounts of components described below refer to amount in the diluted gum that is likely its form for use. However, it is to be understood that concentrated gums can be used and the amounts of various components (such as the anionic surfactants) would be correspondingly increased.

The gum is an aqueous solution that generally has a pH greater than 3 and up to about 9 as adjusted using a suitable amount of a base. The viscosity of the gum can be adjusted to a value of from about 1.7 to about 5 cP by adding a suitable amount of a viscosity increasing compound such as a poly (vinyl alcohol) or poly(ethylene oxide).

In addition, these gums have one or more anionic surfactants even though optional components (described below) can be present if desired. Useful anionic surfactants include those with carboxylic acid, sulfonic acid, or phosphonic acid groups (or salts thereof). Anionic surfactants having sulfonic acid (or salts thereof) groups are particularly useful. Alkyldiphenyloxide disulfonates (such as sodium dodecyl phenoxy benzene disulfonates), alkylated naphthalene sulfonic acids, sulfonated alkyl diphenyl oxides, and methylene dinaphthalene sulfonic acids) are particularly useful as the primary or "first" anionic surfactant. Such surfactants can be obtained from various suppliers as described in McCutcheon's Emulsifiers & Detergents, 2007 Edition.

Particular examples of such surfactants include but are not limited to, sodium dodecylphenoxyoxybenzene disulfonate, the sodium salt of alkylated naphthalenesulfonate, disodium methylene-dinaphthalene disulfonate, sodium dodecylbenzenesulfonate, sulfonated alkyl-diphenyloxide, ammonium or potassium perfluoroalkylsulfonate and sodium dioctylsulfosuccinate.

The one or more anionic surfactants are generally present in an amount of at least 1 weight %, and typically from about 1 to about 45 weight %, or from about 3 to about 30 weight % (based on the weight of the gum).

Two or more anionic surfactants ("first", "second", etc.) can be used in combination. In such mixtures, a first anionic surfactant, such as an alkyldiphenyloxide disulfonate, can be present generally in an amount of at least 1 weight % and typically from about 3 to about 30 weight %. A second surfactant can be present (same or different from the first anionic surfactant) in a total amount of at least 0.1 weight %, and typically from about 2 to about 30 weight %. Second or additional anionic surfactants can be selected from the substituted aromatic alkali alkyl sulfonates and aliphatic alkali sulfates. One particular combination of anionic surfactants includes one or more alkyldiphenyloxide disulfonates and one or more aromatic alkali alkyl sulfonates (such as an alkali alkyl naphthalene sulfonate).

The gums may include nonionic surfactants as described in [0029] or hydrophilic polymers described in [0024] of EP 1,751,625 (noted above), incorporated herein by reference. Particularly useful nonionic surfactants include Mazol® PG031-K (a triglycerol monooleate, Tween® 80 (a sorbitan derivative), Pluronic® L62LF (a block copolymer of propylene oxide and ethylene oxide), and Zonyl® FSN (a fluorocarbon), and a nonionic surfactant for successfully coating the gum onto the printing plate surface, such as a nonionic polyglycol. These nonionic surfactants can be present in an amount of up to 10 weight %, but at usually less than 2 weight %.

Other optional components of the gum include inorganic salts (such as those described in [0032] of U.S. Patent Application 2005/0266349, noted above), wetting agents (such as a glycol), a metal chelating agents, antiseptic agents, antifoaming agents, ink receptivity agents (such as those described in [0038] of US '349), and viscosity increasing agents as noted above. The amounts of such components are known in the art. Calcium ion chelating agents are particularly useful, including but not limited to, polyaminopolycarboxylic acids, aminopolycarboxylic acids, or salts thereof, [such as salts of ethylenediaminetetraacetic acid (EDTA, sodium salt)], organic phosphonic acids and salts thereof, and phosphonoalkanetricarboxylic acids and salts thereof. Organic amines may also be useful. A chelating agent may be present in the gum in an amount of from about 0.001 to about 1 weight %.

Generally, the gum is applied to the imaged precursor by rubbing, spraying, jetting, dipping, coating, or wiping the outer layer with the gum or a roller, impregnated pad, or applicator containing the gum. For example, the imaged precursor can be brushed with the gum, or the gum may be poured on or applied by spraying the outer layer with sufficient force to remove the exposed regions using a spray nozzle system as described for example in [0124] of EP 1,788,431A2 (noted above). Still again, the imaged precursor can be immersed in the gum and rubbed by hand or with an apparatus.

The gum can also be applied in a gumming unit (or gumming station) that has at least one roller for rubbing or brushing the printing plate while the gum is applied during development. By using such a gumming unit, the non-exposed regions of the imaged layer may be removed from the substrate more completely and quickly. The gum used in development can be collected in a tank and the gum can be used several times, and replenished if necessary from a reservoir of gum. The gum replenisher can be of the same concentration as that used in development, or be provided in concentrated form and diluted with water at an appropriate time.

Following off-press development, a postbake operation can be carried out, with or without a blanket or floodwise exposure to UV or visible radiation. The lithographic printing plate can be baked in a postbake operation to increase run length of the resulting imaged element. Baking can be carried out, for example at from about 170° C. to about 240° C. for from about 7 to about 10 minutes, or at about 120° C. for 30 minutes. Alternatively, a blanket UV or visible radiation exposure can be carried out, without a postbake operation.

Printing can be carried out by applying a lithographic ink and fountain solution to the printing surface of the lithographic printing plate. The fountain solution is taken up by the non-imaged regions, that is, the surface of the hydrophilic substrate revealed by the imaging and development steps, and the ink is taken up by the imaged (non-removed) regions of the imaged layer. The ink is then transferred to a suitable receiving material (such as cloth, paper, metal, glass, or plastic) to provide a desired impression of the image thereon. If desired, an intermediate "blanket" roller can be used to transfer the ink from the imaged member to the receiving material. The printing plates can be cleaned between impressions, if desired, using conventional cleaning means.

The present invention provides at least the following embodiments:

Embodiment 1: A lithographic printing plate precursor comprising a substrate and having thereon an imagable layer, the precursor comprising in its outermost layer, polymeric particles having an average diameter of from about 3 to about 20 μm, and the polymeric particles comprising a core of a crosslinked polymer and having grafted hydrophilic polymeric surface groups, which polymeric surface groups are grafted onto the particle surfaces by polymerizing hydrophilic monomers in the presence of the crosslinked polymeric particles.

Embodiment 2: The precursor of embodiment 1 further comprising an outermost topcoat containing the polymeric particles, the topcoat having a dry coverage of from about 0.2 to about 2.5 g/m$^2$.

Embodiment 3: The precursor of embodiment 2 wherein the topcoat comprises a poly(vinyl alcohol).

Embodiment 4: The precursor of any of embodiments 1 to 3 wherein the polymeric particles have an average diameter of from about 3 to about 8 μm.

Embodiment 5: The precursor of any of embodiments 1 to 4 wherein the hydrophilic monomers comprise one or more hydrophilic groups selected from the group consisting of amide, sulfonic acid, sulfonic acid salts, carboxlic acid, carboxylic acid salts, phosphoric acid, phosphoric acid salts, phosphonic acid, phosphonic acid salts, and polyalkylene oxide groups.

Embodiment 6: The precursor of any of embodiments 1 to 5 wherein the grafted hydrophilic polymeric surface groups comprise up to 10 recurring units.

Embodiment 7: The precursor of any of embodiments 1 to 6 that is negative-working having a negative-working imagable layer optionally containing the polymeric particles.

Embodiment 8: The precursor of any of embodiments 1 to 7 wherein the imagable layer comprises:
a free radically polymerizable component,
an initiator composition capable of generating radicals sufficient to initiate polymerization of the free radically polymerizable component upon exposure to imaging radiation,
a radiation absorbing compound, and
a polymeric binder.

Embodiment 9: The precursor of any of embodiments 1 to 8 that is sensitive to imaging radiation having a wavelength of from about 150 to about 450 nm or from about 700 to about 1250 nm.

Embodiment 10: The precursor of embodiment 8 or 9 wherein the initiator composition comprises an onium salt.

Embodiment 11: The precursor of any of embodiments 1 to 10 that is sensitive to infrared imaging radiation.

Embodiment 12: The precursor of any of embodiments 1 to 11 that is negative-working having an imagable layer comprising:
a free radically polymerizable component,
an initiator composition capable of generating radicals sufficient to initiate polymerization of the free radically polymerizable component upon exposure to imaging radiation,
an infrared radiation dye, and
a polymeric binder that is either film-forming or present at least partially as discrete particles,
the precursor further comprising a topcoat disposed on the imagable layer, which topcoat comprises a poly(vinyl alcohol), and the polymeric particles.

Embodiment 13: The precursor of embodiment 12 wherein the polymeric particles have an average diameter in μm that is at least 100% and up to 400% of the dry coverage of the topcoat in g/m$^2$.

Embodiment 14: The precursor of embodiment 13 wherein the polymeric particles comprise grafted hydrophilic polymeric surface groups that comprise one or more hydrophilic groups selected from the group consisting of amide, sulfonic acid, sulfonic acid salts, carboxlic acid, carboxylic acid salts, phosphoric acid, phosphoric acid salts, phosphonic acid, phosphonic acid salts, and polyalkylene oxide groups.

Embodiment 15: A method of providing a lithographic printing plate comprising:
A) imagewise exposing the precursor of any of embodiments 1 to 14 that is negative-working, to provide both exposed and non-exposed regions in the imagable layer, and
B) processing the imaged precursor to remove the non-exposed regions.

Embodiment 16: The method of embodiment 15 wherein the precursor further comprises a topcoat containing said polymeric particles.

Embodiment 17: The method of embodiment 15 or 16 wherein the precursor is IR-sensitive and is imagewise exposed using infrared radiation.

Embodiment 18: A stack of at least 5 of the lithographic printing plate precursors of any of embodiments 1 to 14 wherein the outermost layer of each precursor is in direct contact with the substrate of each successive precursor in the stack.

Embodiment 19: The stack of embodiment 18 comprising at least 100 lithographic printing plate precursors.

Embodiment 20: The stack of embodiment 18 or 19 wherein the precursors are negative-working and sensitive to imaging radiation having a wavelength of from about 150 to about 450 nm or from about 700 to about 1250 nm.

The following examples are provided to illustrate the practice of this invention and not meant to be limiting in any manner.

Examples

The following materials were used in the examples:

Preparation 1: 160 g of Dowanol® PM (propylene glycol methyl ether-PGME) and 20 g of SBX-6 μm beads, [available from Sekisui Plastics Co. LTD (Japan)] were charged to a 500 ml 4-neck ground glass flask, equipped with a heating mantle, temperature controller, mechanical stirrer, condenser, pressure equalized addition funnel and nitrogen inlet. The reaction mixture was heated to 80° C. under nitrogen atmosphere. A pre-mixture of 20 g of acrylic acid and 0.4 g of Vazo-64 polymerization initiator was added over 30 minutes. The reaction was continued for four hours at 80° C. and then cooled to room temperature and filtered through fitter paper #50 (particle retention 2.7 μm). The solid material was re-slurried in 100 g of PGME plus 300 g of deionized water, and the reaction mixture was stirred for one hour at room temperature. The solution was then filtered, solid material was re-slurried in 400 g of water, and the solution was stirred for another hour. The solution was filtered and the resulting polymer was dried in an oven at 60° C. for 16 hours. The actual acid number of the polymer powder was 2.7.

Preparation 2: 10 g of the Preparation 1 material and 70 g of DMAC were charged to 150 ml glass beaker and stirred for 15 minutes at room temperature and then 30 g of water containing a NaOH (0.1 g) solution was added, causing a mild exotherm to occur. After stirring 30 minutes at room temperature, the mixture was heated to 50° C. and kept for half an hour. It was then cooled to room temperature and filtered through fitter paper #50 (particle retention 2.7 μm). The resulting solid material was re-slurried in 500 g of deionized water and stirred for one hour. The solution was filtered the solid material was dried overnight at room temperature, and next day it was put in oven at 80° C. for 4 hours.

Preparation 3: 60 g of an n-propanol/water (1:1) mixture, 20 g of SBX-6 μm beads [available from Sekisui Plastics Co. LTD (Japan)], 20 g of acrylic acid, and 0.6 g of Vazo-64 initiator were charged into a 500 ml 4-neck ground glass flask, equipped with a heating mantle, temperature controller, mechanical stirrer, condenser, pressure equalized addition funnel, and nitrogen inlet. The reaction mixture was heated to 75° C. under nitrogen atmosphere and it was continued for four hours at 75° C. The solution viscosity was high and therefore it was diluted with 350 g of the n-propanol/water mixture (1:1) and was then filtered through filter paper #50. The resulting solid material was re-slurried in 600 g of water and stirred for one hour, followed by filtration. The solid material was dried in an oven at 60° C. for 16 hours. The actual acid number of the powder was 3.03 (similar to Preparation 1).

Preparation 4: 60 g of N,N'-dimethylacetamide (DMAC), 20 g of SBX-6 μm beads [available from Sekisui Plastics Co. LTD (Japan)], 20 g of methacrylamide, and 0.6 g of Vazo-64 were charged into a 250 ml 4-neck ground glass flask, equipped with a heating mantle, temperature controller, mechanical stirrer, condenser, pressure equalized addition funnel, and nitrogen inlet. The reaction mixture was heated to 75° C. under nitrogen atmosphere and was continued for four hours at 75° C. It was then cooled to room temperature and filtered through fitter paper #50 (particle retention 2.7 μm). The resulting solid material was re-slurried in 600 g of deionized water and stirred for 1.5 hours at room temperature. The solution was then filtered and the solid material was dried in an oven at 80° C. for 6 hours.

Preparations 4A, 4B, and 4C: The same procedure of Preparation 4 was used except the weight ratio of SBX-6 μm beads and methacrylamide were varied as follows: Preparation 4A included 20 g of SBX-6 μm beads and 10 g of methacrylamide at a ratio of 1:0.5; Preparation 4B included 20 g of SBX-6 μm beads and 5 g of methacrylamide at a ratio of 1:0.25, and Preparation 4C included 20 g of SBX-6 μm beads and 2.5 g of methacrylamide at a ratio of 1:0.125.

Preparation 5: 60 g of DMAC, 20 g of SBX-6 μm beads, 40 g of PEGMA (50% in $H_2O$), and 0.6 g of Vazo-64 were charged into a 250 ml 4-neck ground glass flask, equipped with a heating mantle, temperature controller, mechanical stirrer, condenser, pressure equalized addition funnel, and nitrogen inlet. The reaction mixture was heated to 75° C. under nitrogen atmosphere and was continued for four hours at 75° C. The procedure was then the same as described for Preparation 4 to achieve the final product.

Preparation 6: 60 g of DMAC, 20 g of SBX-6μ beads, 5.0 g of 1-vinyl-2-pyrrolidone, and 0.6 g of Vazo-64 were charged into a 250 ml 4-neck ground glass flask, equipped with a heating mantle, temperature controller, mechanical stirrer, condenser, pressure equalized addition funnel, and nitrogen inlet. The reaction mixture was heated to 75° C. under nitrogen atmosphere and was continued for four hours at 75° C. The procedure was then the same as described for Preparation 4 to achieve the final product.

Preparation 7: 60 cg of DMAC, 20 g of SBX-6 μm beads, 10 g of 2-acrylamido-2-methyl-1-propanesulfonic acid (AMPS), and 0.6 g of Vazo-64 were charged into a 250 ml 4-neck ground glass flask, equipped with a heating mantle, temperature controller, mechanical stirrer, condenser, pressure equalized addition funnel, and nitrogen inlet. The reaction mixture was heated to 75° C. under nitrogen atmosphere and the reaction was continued for four hours at 75° C. The procedure remained the same as in Preparation 4 to achieve the final product.

Preparation 7A: The same procedure was followed as described in Preparation 7 except that the amounts of the SBX-6 μm beads and 2-acrylamido-2-methyl-1-propanesulfonic acid (AMPS) were changed to 20 g and 5 g, respectively.

Preparation 8: 60 g of DMAC, 20 g of SBX-6 μm beads, 10 g of 4-styrene sulfonic acid Na-salt, and 0.6 g of Vazo-64 were charged into a 250 ml 4-neck ground glass flask, equipped with a heating mantle, temperature controller, mechanical stirrer, condenser, pressure equalized addition funnel, and nitrogen inlet. The reaction mixture was heated to 75° C. under nitrogen atmosphere and the reaction was continued for four hours at 75° C. The procedure described in Preparation 4 was then followed to achieve the final product.

Preparation 8A: The procedure of Preparation 8 was followed except that the amounts of SBX-6 μm beads and 4-styrene sulfonic acid Na-salt were changed to 20 g and 5 g, respectively.

Tests at 1% (by Weight) in Deionized Water and Alkaline Developer (pH 9.7):

SBX-6 μm beads were dissolved in deionized water and stirred for one hour at room temperature. The resulting solution had very poor wetting characteristics. When the same beads were stirred in an alkaline developer, they remained in the slurry and particles settled to bottom of the beaker. The results for the various Preparation compositions are shown as follows in TABLE I:

TABLE I

| Preparation | Composition | Deionized Water | Alkaline Developer (pH 9.7) |
| --- | --- | --- | --- |
| 1 | SBX-6 μm beads/ acrylic acid (1:1 wt. ratio) | Some particles floated on the surface | The particles remained in the slurry |
| 2 | SBX-6 μm beads/ acrylic acid-neutralized with NaOH | The particles floated on the surface (no difference seen compared to Preparation 1) | The particles remained in the slurry |
| 3 | SBX-6 μm beads/- acrylic acid (1:1 wt. ratio) | Some particles floated on the surface | The particles remained in the slurry |
| 4 | SBX-6 μm beads/- methacrylamide (1:1 wt. ratio) | All particles settled (best wetting characteristic) | The particles remained in the slurry |
| 4A | SBX-6 μm beads/- methacrylamide (1:0.5 wt. ratio) | All particles settled (best wetting characteristics) | The particles remained in the slurry |
| 4B | SBX-6 μm beads/- methacrylamide (1:0.25 wt. ratio) | Most of the particles settled (very few particles floated on the surface) | Most of the particles settled (very few particles floated on the surface) |

TABLE I-continued

| Preparation | Composition | Deionized Water | Alkaline Developer (pH 9.7) |
|---|---|---|---|
| 4C | SBX-6 μm beads/-methacrylamide (1:0.125 wt. ratio) | Most of the particles settled (some particles floated on the surface) | Most of the particles settled (some of the particles floated on the surface) |
| 5 | SBX-6 μm beads/-PEGMA (1:1 wt. ratio) | Most of the particles settled (some particles floated on the surface) | Most particles remained in the slurry |
| 6 | SBX-6 μm beads/1-vinyl-pyrrolidone (1:0.25 wt. ratio) | Some particles floated on the surface | Very few particles floated on the surface and on the next day it remained the same. Most of the particles settled |
| 7 | SBX-6 μm beads/-AMPS (1:0.5 wt. ratio) | Most particles floated on the surface | The particles remained in the slurry |
| 7A | SBX-6 μm beads/-AMPS (1:0.25 wt. ratio) | Most particles floated on the surface | The particles remained in the slurry |
| 8 | SBX-6 μm beads/SS-Na salt (1:0.5 wt. ratio) | Most particles floated on the surface | The particles remained in the slurry |
| 8A | SBX-6 μm beads/SS-Na salt (1:0.25 wt. ratio) | Excellent wetting characteristics | The particles remained in the slurry |

Note:
(1) No difference was seen in wetting characteristics with and without neutralization of the —COOH groups with sodium hydroxide;
(2) when various ratios of methacrylamide were used, the best wetting characteristics were achieved in water, for example in Preparations 4 > 4A > 4B > 4C; and
(3) when the polymeric particles were surface-grafted using varying amounts of poly-4-styrene sulfonic acid Na salt, the dispersion stability in water were shown to be Preparation 8A > 8.

Evaluation of Printing Plate Precursors:

Comparative Example 1

The following components in TABLE II were dissolved in a mixture of solvents containing 50 wt. % 2-methoxypropanol and 50 wt. % 2-butanone to form an imagable layer formulation containing 8 wt. % solids. This formulation was coated at a dry coverage of 1.3 g/m² onto an aluminum substrate that has been treated by a typical process for lithographic printing plate, including degreasing, electrochemical graining, anodizing and sealing with poly(vinyl phosphonic acid). The coating was dried at 100° C. for 1 minute.

TABLE II

| Component | Amount (% solids) |
|---|---|
| AIP-22 | 25.05 |
| CYC-1 | 25.05 |
| DPHA | 35.32 |
| 2-(4-methoxyphenyl)-4,6-bis(trichloromethyl)-1,3,5-triazine | 7.14 |
| CY-20(T) | 2.32 |
| D-11 | 3.28 |
| MDP | 0.93 |
| DH-2002 | 0.41 |
| P3B | 0.50 |

AIP-22

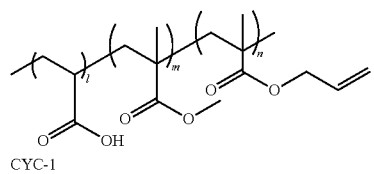

CYC-1

TABLE II-continued

| Component | Amount (% solids) |
|---|---|

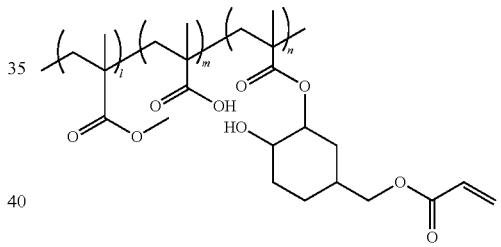

AIP-22 is a copolymer of the structure shown above wherein k is 16.5, m is 55.5, and n is 28.0.

CYC-1 is a copolymer of the structure shown above wherein k is 54.4, m is 10.7, and n is 34.9.

D11 has the following structure:

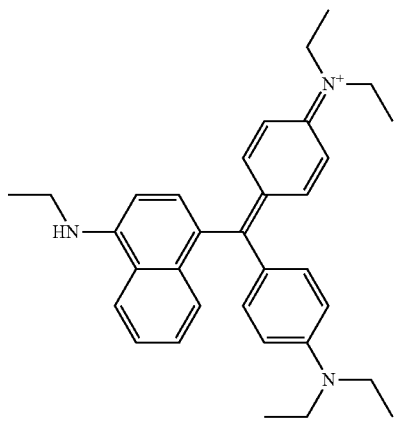

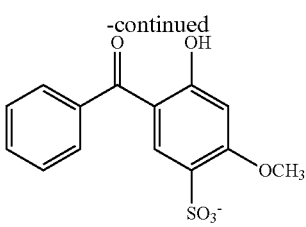

DPHA represents dipentaerythritol ether hexaacrylate.

CY-20T is an infrared absorbing cyanine dye that is available from Kayasorb (Japan).

P3B represents tetrabutyl ammonium triphenylbutyl borate.

DH-2002 is a copolymer having a perfluoroalkyl group and methacryloyl group in side chains.

MDP is 4,4'-methylenebis(2,6-di-t-butylphenol) having the following structure:

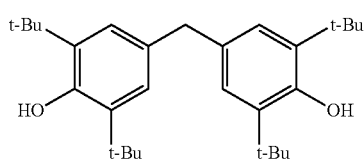 [SMILES: CC(C)(C)c1cc(Cc2cc(C(C)(C)C)c(O)c(C(C)(C)C)c2)cc(C(C)(C)C)c1O]

The solid components in the following TABLE III were dissolved into water to form a solution with 3.3 wt. % solid content and the solution was applied onto the imagable layer described above to form an overcoat (topcoat) at a dry coverage of 0.5 g/m$^2$.

TABLE III

| Component | Amount (% solids) |
|---|---|
| PVA-203 | 70.20 |
| PVP K-30 | 9.10 |
| Newcol 2305 | 2.60 |
| Newcol 2320 | 5.20 |
| pTsa Na salt | 3.90 |
| SBX-6 | 9.00 |

Newcol 2305 is a polyoxyethylene alkyl ether (HLB of 10.7, Nippon Nyukazai).
Newcol 2320 is a polyoxyethylene alkyl ether (HLB of 16.4, Nippon Nyukazai).
PVP K-30 is a poly(vinyl pyrrolidone).
PVA-203 is a poly(vinyl alcohol).
SBX-6 μm contains crosslinked polystyrene beads with 6 μm diameter and 1.06 g/cm$^3$ density.
pTsa Na salt represents p-toluenesulfonic acid sodium salt.

Comparative Example 2

Comparative Example 1 was repeated except that the following components in TABLE IV were used in the overcoat (topcoat) formulation.

TABLE IV

| Component | Amount (% solids) |
|---|---|
| PVA-203 | 70.20 |
| VPC55K65W | 9.10 |
| Newcol 2305 | 2.60 |
| Newcol 2320 | 5.20 |
| pTsa Na salt | 3.90 |
| SBX-6 | 9.00 |

VPC55K65W is a copolymer derived from vinyl pyrrolidone and vinyl caprolactam at a 1:1 molar ratio (viscosity K of 65, from BASF Luvitec).

Invention Examples 1-4

Particles from Preparations 4, 4A, 4B, and 4C were used to replace SBX-6 μm in Comparative Example 1 above.

Invention Examples 5-8

Particles from Preparations 4, 4A, 4B, and 4C were used to replace SBX-6 μm in Comparative Example 2 above.

Samples of the printing plate precursors of Comparative Examples 1 and 2 and Invention Examples 1-8 were rubbed once with interleaving paper under a weight of 50 g (contact area about 300 mm$^2$) and then their outer surfaces were evaluated using SEM. It was observed that the SBX-6 μm particles incorporated into the topcoats of Comparative Examples 1 and 2 were rubbed off more easily than the particles incorporated into the topcoats of Invention Examples 1-8. Thus, more voids were formed in the topcoats of Comparative Examples 1 and 2.

Figure 2:
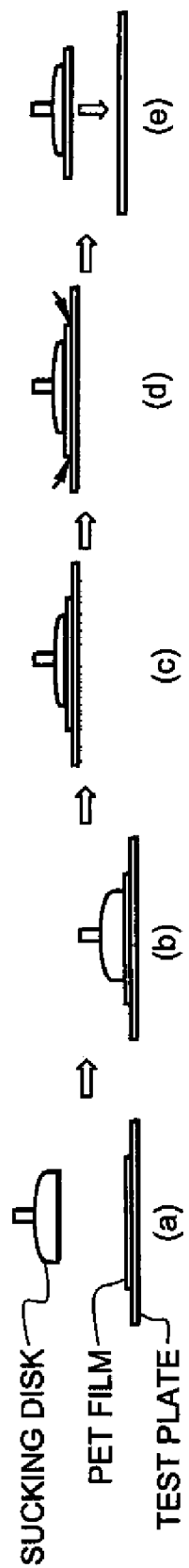
FIG. 2 is a schematic illustration of the steps used in the Plate Release Test shown below in evaluation of the Examples.

Plate Release Test:

Samples of printing plate precursors from Comparative Example 1 (SBX-6 μm particles) and Invention Examples 1-4 (using Preparations 4, 4A, 4B, and 4C) were trimmed to 7×7 cm size. A polyethylene terephthalate (PET) film (5×5 cm) was placed on each printing plate sample, and then this test plate was picked up using a suction disk through the PET film. The test procedure is described below and illustrated schematically in FIG. 2.

Procedure:

In order to prevent trouble in an auto loader of an image setter for newspaper printing, it is necessary that the retention time in the Plate Release Test be short. The measurement procedure for the Plate Release Test is described as follows and illustrated in FIG. 2.

(a) The PET film was placed on test plate.
(b) The suction disk was placed on PET film.
(c) The printing plate precursor sample was picked up using the suction disk through the PET film.
(d) The air was flowed into the narrowest gap between PET film and test plate.
(e) The printing plate precursor fell from air inflow.

The retention time until the printing plate precursor fell was measured as a value reflecting printing plate precursor loading property (10 times average). The results are shown in the graph of FIG. 1 (Release time in seconds for the various Preparations and Comparative Example 1).

The invention has been described in detail with particular reference to certain preferred embodiments thereof, but it will be understood that variations and modifications can be effected within the spirit and scope of the invention.

The invention claimed is:

1. A lithographic printing plate precursor comprising a substrate and having thereon an imagable layer, the precursor comprising in its outermost layer, polymeric particles having an average diameter of from about 3 to about 20 μm, and the polymeric particles comprising a core of a crosslinked polymer and having grafted hydrophilic polymeric surface groups, which polymeric surface groups are grafted onto the particle surfaces by polymerizing hydrophilic monomers in the presence of the crosslinked polymeric particles, wherein the polymeric particles comprise grafted hydrophilic polymeric surface groups that comprise one or more hydrophilic groups selected from the group consisting of amide, sulfonic acid, sulfonic acid salts, carboxylic acid, carboxylic acid salts, phosphoric acid, phosphoric acid salts, phosphonic acid, phosphonic acid salts, and polyalkylene oxide groups, wherein the outermost layer is an outermost topcoat containing the polymeric particles, said topcoat having a dry coverage of from about 0.2 to about 2.5 g/m².

2. The precursor of claim 1 wherein the topcoat comprises a poly(vinyl alcohol).

3. The precursor of claim 1 wherein the polymeric particles have an average diameter of from about 3 to about 8 μm.

4. The precursor of claim 1 wherein the grafted hydrophilic polymeric surface groups comprise up to 10 recurring units.

5. The precursor of claim 1 wherein the imagable layer comprises:
a free radically polymerizable component,
an initiator composition capable of generating radicals sufficient to initiate polymerization of the free radically polymerizable component upon exposure to imaging radiation,
a radiation absorbing compound, and
a polymeric binder.

6. The precursor of claim 5 that is sensitive to imaging radiation having a wavelength of from about 150 to about 450 nm or from about 700 to about 1250 nm.

7. The precursor of claim 5 wherein the initiator composition comprises an onium salt.

8. The precursor of claim 1 that is sensitive to infrared imaging radiation.

9. The precursor of claim 1 that is negative-working that has an imagable layer comprising:
a free radically polymerizable component,
an initiator composition capable of generating radicals sufficient to initiate polymerization of the free radically polymerizable component upon exposure to imaging radiation,
an infrared radiation dye, and
a polymeric binder that is either film-forming or present at least partially as discrete particles,
said precursor further comprising a topcoat disposed on the imagable layer, which topcoat is the outermost layer and comprises a poly(vinyl alcohol), and said polymeric particles.

10. A method of providing a lithographic printing plate comprising:
A) imagewise exposing the precursor of claim 1 that is negative-working, to provide both exposed and non-exposed regions in the imagable layer, and
B) processing the imaged precursor to remove the non-exposed regions.

11. The method of claim 10 wherein the precursor is IR-sensitive and is imagewise exposed using infrared radiation.

12. A stack of at least 5 of the lithographic printing plate precursors of claim 1 wherein the outermost layer of each precursor is in direct contact with the substrate of each successive precursor in the stack.

13. The stack of claim 12 comprising at least 100 lithographic printing plate precursors.

14. The stack of claim 12 wherein the precursors are negative-working and sensitive to imaging radiation having a wavelength of from about 150 to about 450 nm or from about 700 to about 1250 nm.

* * * * *